(12) United States Patent
Song et al.

(10) Patent No.: US 10,755,608 B2
(45) Date of Patent: Aug. 25, 2020

(54) DISPLAY DEVICE

(71) Applicant: Samsung Display Co., Ltd., Yongin-Si, Gyeonggi-Do (KR)

(72) Inventors: Hee Rim Song, Seoul (KR); Gyung Soon Park, Seoul (KR); Mu Kyung Jeon, Ulsan (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/512,284

(22) Filed: Jul. 15, 2019

(65) Prior Publication Data

US 2020/0090559 A1 Mar. 19, 2020

(30) Foreign Application Priority Data

Sep. 14, 2018 (KR) .......................... 10-2018-0110373

(51) Int. Cl.
| | |
|---|---|
| *G09G 3/20* | (2006.01) |
| *G09F 9/30* | (2006.01) |
| *G02F 1/1333* | (2006.01) |
| *H01L 51/00* | (2006.01) |
| *H01L 27/32* | (2006.01) |

(52) U.S. Cl.
CPC ........ *G09F 9/301* (2013.01); *G02F 1/133305* (2013.01); *H01L 27/326* (2013.01); *H01L 27/3276* (2013.01); *H01L 51/0097* (2013.01); *G02F 2202/02* (2013.01); *G09G 2300/0426* (2013.01); *H01L 2251/5338* (2013.01)

(58) Field of Classification Search
CPC . G09G 9/301; G02F 1/133305; H01L 27/326; H01L 27/3276; H01L 51/0097
USPC .......................................................... 345/55
See application file for complete search history.

(56) References Cited

U.S. PATENT DOCUMENTS

| | | | |
|---|---|---|---|
| 2010/0302495 A1* | 12/2010 | Jeong | .................... G02F 1/1339 |
| | | | 349/153 |
| 2017/0069666 A1* | 3/2017 | Koide | ................. H01L 27/1244 |
| 2017/0288002 A1 | 10/2017 | Kim et al. | |
| 2017/0336688 A1* | 11/2017 | Yamamoto | ............ G02F 1/1345 |
| 2018/0108310 A1* | 4/2018 | Dong | .................. G02F 1/13454 |

FOREIGN PATENT DOCUMENTS

KR   2017-0051667 A   5/2017

\* cited by examiner

*Primary Examiner* — Jonathan M Blancha
(74) *Attorney, Agent, or Firm* — Innovation Counsel LLP

(57) ABSTRACT

A display device may include a first pixel, a second pixel, a first data line electrically connected to the first pixel, a second data line electrically connected to the second pixel and electrically insulated from the first data line, a first signal wire electrically connected to the first data line, a second signal wire electrically connected to the second data line, and a connecting wire electrically connecting the second data line to the second signal wire. The connecting wire may include a first section and a second section. The second section may be directly connected to the first section, may overlap the first pixel, may overlap the first data line, and may be oblique relative to each of the first data line and the second data line in a plan view of the display device.

20 Claims, 17 Drawing Sheets

DISPLAY DEVICE

This application claims priority to and the benefit of Korean Patent Application No. 10-2018-0110373, filed on Sep. 14, 2018, in the Korean Intellectual Property Office; the disclosure of the Korean Patent Application is incorporated herein by reference in its entirety.

BACKGROUND

1. Field

The technical field relates to a display device.

2. Description of the Related Art

A display device may include pixel circuits, a driver for driving the pixel circuits, and wire electrically connecting the driver to the pixel circuits. The pixel circuits may be disposed in a display area of the display device. The driver may be disposed in a non-display area neighboring the display area. The wires may extend from the non-display area to the display area.

SUMMARY

Embodiments may be related to a fan-out structure disposed in a display area of a display device to optimize space utilization of the display device.

According to some embodiments, a display device comprises a display substrate on which data lines comprising a first data line disposed in a first area of a display area and a second data line disposed in a second area of the display area are disposed, signal wires which comprise a first signal wire connected to the first data line and a second signal wire connected to the second data line, and a connecting wire which connects the second data line and the second signal wire. The first data line and the second data line extend in a first direction, the second area is disposed adjacent to the first area in a second direction intersecting the first direction, and the connecting wire has a fan-out structure in the display area.

The display substrate may comprise a non-display area around the display area. The non-display area may comprise a third area disposed adjacent to the first area of the display area in the first direction and a fourth area disposed adjacent to the second area of the display area in the second direction.

The non-display area may comprise a bending portion, and the signal wires may be disposed in the bending portion.

The width of the bending portion in the second direction may be smaller than the width of the display area in the second direction.

The connecting wire may be connected to the second signal wire through a first contact hole located in the third area.

The connecting wire may be connected to the second data line through a second contact hole located in the fourth area.

The connecting wire may comprise a first extension portion extending from the non-display area toward the display area along the first direction and a second extension portion extending from an end of the first extension portion toward the non-display area along an oblique direction between the first direction and the second direction.

The first signal wire may be made of the same conductive layer as the second signal wire.

The connecting wire may be disposed at a predetermined distance from the first data line along the second direction in a plan view of the display device.

The connecting wire may overlap the first data line in some areas in a thickness direction.

The connecting wire may be at least any one of aluminum (Al) and a stacked layer of Ti—Al—Ti.

The second signal wire may be connected to the connecting wire through a third signal wire, and the third signal wire is made of the same conductive layer as the first data line.

A first organic insulating layer may be disposed between the connecting wire and the data lines.

The first organic insulating layer may have a thickness of 15000 Å.

The first organic insulating layer may be any one of polyacrylics resin and polyimides resin.

The display device may further comprise a second organic insulating layer on a conductive layer in which the connecting wire is disposed.

An inorganic insulating layer may be disposed between the connecting wire and the data lines.

The data lines may be disposed on the conductive layer in which the connecting wire is disposed.

The display device may further comprise a second organic insulating layer on a conductive layer in which the data lines are disposed.

The connecting wire may comprise at least any one of copper (Cu) and molybdenum (Mo).

An embodiment may be related to a display device. The display device may include a first pixel, a second pixel, a first data line electrically connected to the first pixel, a second data line electrically connected to the second pixel and electrically insulated from the first data line, a first signal wire electrically connected to the first data line, a second signal wire electrically connected to the second data line, and a connecting wire electrically connecting the second data line to the second signal wire. The connecting wire may include a first section and a second section. The second section may be directly connected to the first section, may overlap the first pixel, may overlap the first data line, and may be oblique relative to each of the first data line and the second data line in a plan view of the display device.

The second section may be at an acute angle relative to the first section in the plan view of the display device.

An edge of the second section may be directly connected to an edge of the first section and may extend at an acute angle relative to the edge of the first section in the plan view of the display device.

The display device may include a third pixel. The first section may overlap the third pixel.

The connecting wire may be connected to the second signal wire through a first contact hole. The connecting wire may be connected to the second data line through a second contact hole. A portion of the first data line may be positioned between the first contact hole and the second contact hole in the plan view of the display device.

The connecting wire may be connected to the second signal wire through a first contact hole. The first contact hole may be located beyond a display area of the display device in a lengthwise direction of the first section. The first pixel and the second pixel may be located in the display area of the display device.

The connecting wire may be connected to the second data line through a second contact hole. The second contact hole may be located beyond the display area of the display device in a lengthwise direction of the second section.

The first pixel and the second pixel may be located in a display area of the display device. A non-display area of the display device may neighbor the display area of the display device. A boundary between the display area of the display device and the non-display area of the display device may intersect both the first section and the second section in the plan view of the display device.

A material of the first signal wire may be identical to a material of the second signal wire.

The first section of the connecting wire may be parallel to the first data line in the plan view of the display device. The second section of the connecting wire may intersect the first data line in the plan view of the display device.

The first section the connecting wire may overlap the first data line. An edge of the first section of the connecting wire may be parallel to an edge of the first data line.

The connecting wire may be formed of at least one of aluminum (Al) and titanium (Ti).

The second signal wire may be connected to the connecting wire through a third signal wire. A material of the third signal wire may be identical to a material of the first data line.

The display device may include a first organic insulating layer disposed between the connecting wire and each of the first data line and the second data line.

The first organic insulating layer may have a thickness of at least 15000 Å.

The first organic insulating layer may be formed of at least one of polyacrylics resin and polyimides resin.

The display device may include a second organic insulating layer covering the connecting wire.

The display device may include an inorganic insulating layer disposed between the connecting wire and the first data line.

The first data line may be disposed between the connecting wire and a pixel electrode of the first pixel in a direction perpendicular to a face of the pixel electrode of the first pixel.

The display device may include an organic insulating layer covering the first data line.

The connecting wire may include at least one of copper (Cu) and molybdenum (Mo).

DETAILED DESCRIPTION

Figure 1:
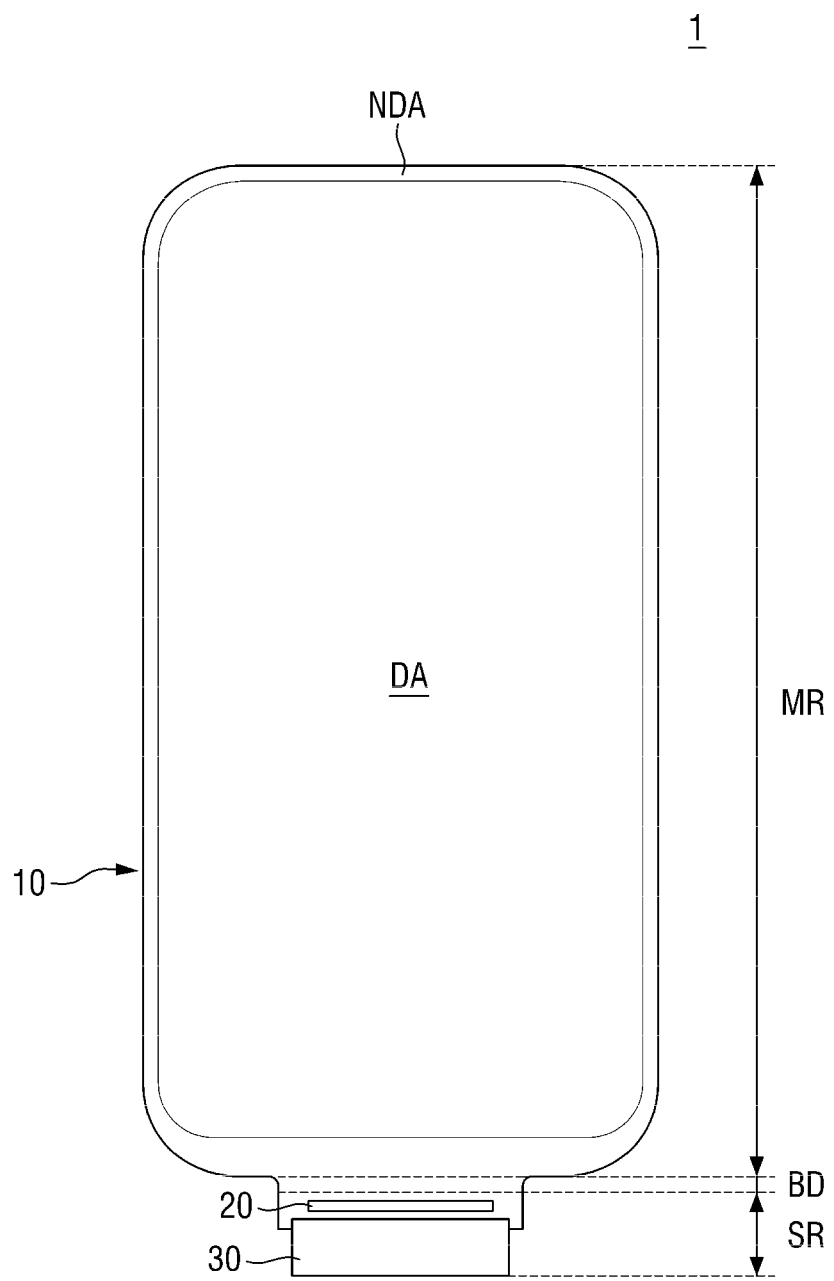
FIG. 1 is a plan/layout view of a display device according to an embodiment.

Example embodiments are described with reference to the accompanying drawings. Practical embodiments are not limited to the example embodiments and can be implemented in various forms.

Although the terms "first," "second," etc. may be used herein to describe various elements, these elements, should not be limited by these terms. These terms may be used to distinguish one element from another element. Thus, a first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively.

When a first element is referred to as being "on" a second element, the first element can be directly on the second element, or one or more intervening elements may be present between the first element and the second element. When a first element is referred to as being "directly on" a second element, there are no intended intervening elements (except environmental elements such as air) present between the first element and the second element.

Spatially relative terms, such as "beneath," "below," "lower," "above," "upper" and the like, may be used herein for ease of description to describe one element or feature's relationship to another element(s) or feature(s) as illustrated in the figures. The spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Same drawing reference numerals may be used for same elements. The term "contact" may mean "directly contact"; the term "connect" may mean "electrically connect." Conductive components in/of a same conductive layer may include and/or be formed of one or more same materials through one or more same process steps.

Figure 2:
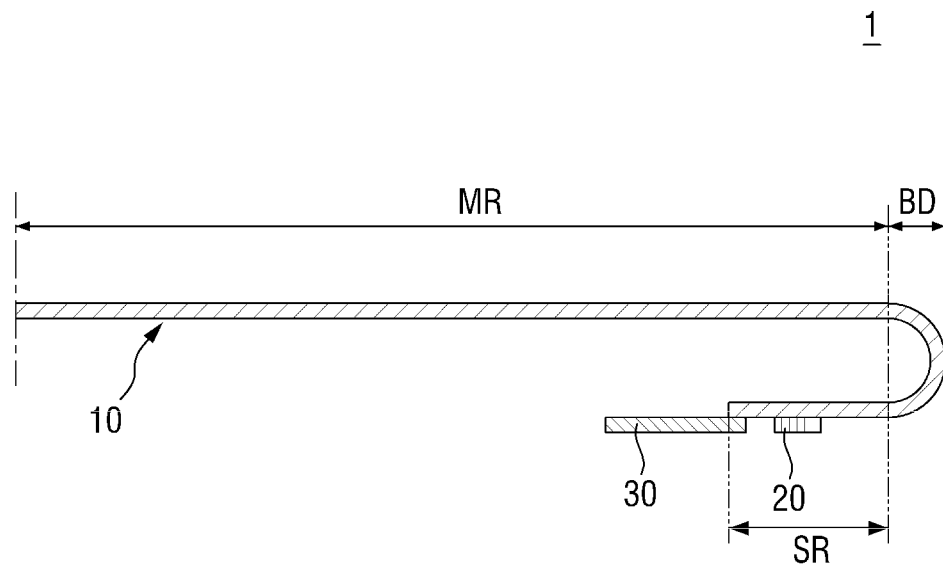
FIG. 2 is a schematic partial cross-sectional view of the display device according to an embodiment.
Figure 3:
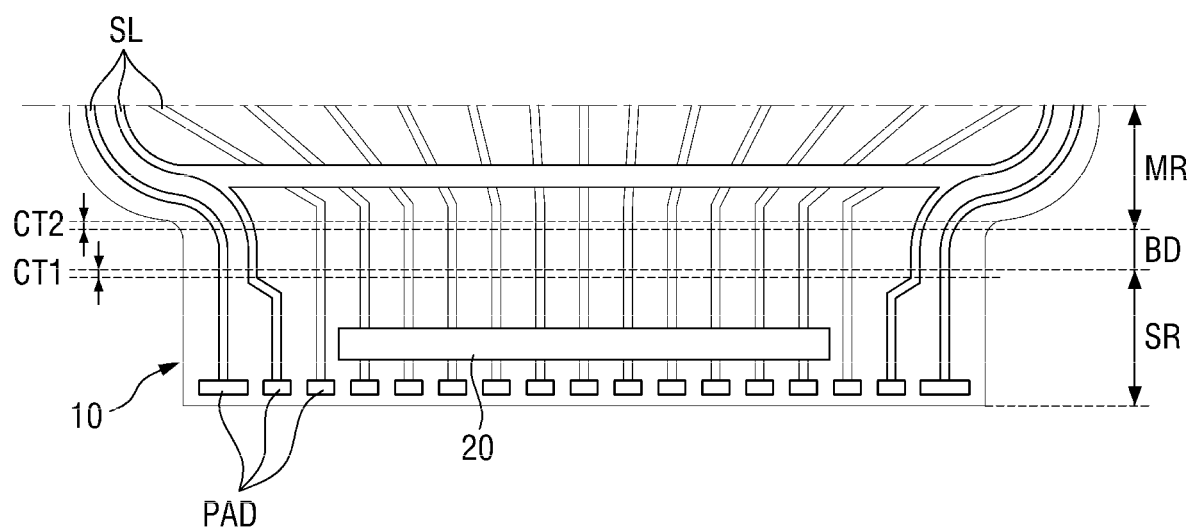
FIG. 3 is a plan/layout view of signal wires extending through a panel bending area according to an embodiment.

FIG. 1 is a plan/layout view of a display device 1 according to an embodiment. FIG. 2 is a schematic partial cross-sectional view of the display device 1 according to an embodiment. FIG. 3 is a layout view of signal wires SL extending through a panel bending area. BD according to an embodiment.

In the plan view of FIG. 1, an up and down direction and a left and right direction are defined for ease of description. The up and down direction is a vertical direction r a pixel column direction, and the left and right direction is a horizontal direction or a pixel row direction. Directions mentioned in embodiments may be relative directions, and the embodiments are not limited to the mentioned directions.

Referring to FIGS. 1 through 3, the display device 1 is a device for displaying moving images or still images. The display device 1 may be used in a portable electronic device such as a mobile phone, a smartphone, a tablet personal computer (PC), a smart watch, a watch phone, a mobile communication terminal, an electronic notebook, an electronic book, a portable multimedia player (PMP), a navigation system and an ultra-mobile PC (UMPC). The display device 1 may be used in at least one of a television, a notebook computer, a monitor, a billboard, and the Internet of things. For example, the display device 1 may include an organic light emitting display, a liquid crystal display, a plasma display, a field emission display, an electrophoretic display, an electrowetting display, a quantum dot light emitting display, or a micro light emitting diode (LED) display. An organic light emitting display is described as an example of the display device 1, but embodiments are not limited to the organic light emitting display.

The display device 1 may include a display panel 10. The display panel 10 may include a flexible substrate containing a flexible polymer material such as polyimide. The display panel 10 can be curved, bent, folded, or rolled.

The display panel 10 may include a main area MR and a panel bending area BD connected to a side of the main area MR. The display panel 10 may further include a sub-area SR connected to the panel bending area BD and overlapping the main area MR in a direction perpendicular to an image display face of the display panel 10 after the panel bending area BD has been bent.

A portion of the display panel 10 that includes pixels for displaying an image is defined as a display area DA of the display device 1, and a portion of the display panel 10 that does not include pixels is defined as a non-display area NDA of the display device 1. The display area DA of the display panel 10 is disposed in the main area MR. The remaining portion excluding the display area DA is the non-display area NDA of the display panel 10. In an embodiment, an edge portion around the display area DA in the main area MR, the entire panel bending area BD, and the entire sub-area SR may be (portions of) the non-display area NDA. In an embodiment, the panel bending area BD and/or the sub-area SR may include pixels and may be portions of the display area DA.

The main area MR may have a shape substantially similar to the planar shape of the display device 1. The main area MR may have a flat face for displaying an image. In an embodiment, curved/bent edges of the main area MR may be configured to display one or more images.

The display area DA of the display panel 10 may be disposed in the middle of the main area MR. The display area DA may include a plurality of pixels. Each of the pixels may include a light emitting layer and a circuit layer for controlling the amount of light emitted from the light emitting layer. The circuit layer may include a display wire, a display electrode, and at least one transistor. The light emitting layer may include an organic light emitting material. The light emitting layer may be sealed by an encapsulation layer. The display area DA may have a substantially rectangular shape, e.g., a rectangular shape with rounded corners. The display area DA may also have one or more other shapes, such as one or more of other polygonal shapes, a circular shape and an elliptical shape.

The display area DA may or may not include a curved or bent edge of the main area MR.

The non-display area NDA may be located around the display area. DA in the main area MR. The non-display area NDA of the main area MR may extend from an outer boundary of the display area DA to edges of the display panel 10. Signal wires SL or driving circuits for transmitting signals to the display area DA may be disposed in the non-display area NDA of the main area MR. An outermost black matrix may be disposed in the non-display area NDA of the main area MR.

The panel bending area BD is connected to the main area MR. For example, the panel bending area BD may be connected to a side of the main area MR. The width of the panel bending area BD may be smaller than the width of the main area MR. The panel bending area BD of the display panel 10 may be bent with a curvature in a direction opposite to a display surface. The panel bending area BD may have a constant radius of curvature. The panel bending area BD may also have different radii of curvature in different sections. As the panel bending area BD of the display panel 10 is bent, a surface of the display panel 10 is inverted. That is, a surface of the display panel 10 which faces upward may be made to face outward and then downward through the panel bending area BD.

The sub-area SR extends from the panel bending area BD. The sub-area SR may extend parallel to the main area MR after the completion of bending. The sub-area SR may overlap the main area MR in the thickness direction of the display panel 10. The sub-area SR may overlap the non-display region NDA on an edge of the main area MR and may further overlap the display area DA of the main area MR.

The width of the sub-area SR may be equal to the width of the panel bending area BD.

A driving chip 20 may be disposed on the sub-area SR of the display panel 10. The driving chip 20 may include an integrated circuit for driving the display panel 10. In an embodiment, the integrated circuit may be a data driver integrated circuit that generates and provides a data signal. The driving chip 20 may be mounted on the display panel 10 in the sub-area SR. The driving chip 20 may be mounted on a surface of the display panel 10 which is the same surface as the display surface. However, as the panel bending area BD is bent and inverted as described above, the surface of the display panel 10 on which the driving chip 20 is mounted may be made to face downward in the thickness direction. Accordingly, an upper surface of the driving chip 20 may face downward.

The driving chip 20 may be attached onto the display panel 10 by an anisotropic conductive film or by ultrasonic bonding. A horizontal width of the driving chip 20 may be smaller than a horizontal width of the display panel 10. The driving chip 20 may be disposed in the middle of the sub-area SR in the horizontal direction, and left and right edges of the driving chip 20 may be spaced apart from left and right edges of the sub-area SR, respectively.

Pads PAD may be provided at an end of the sub-area SR, of the display panel 10, and a display driving board 30 may be connected to the pads PAD. The display driving board 30 may be a flexible printed circuit board or a film.

The signal wires SL may be disposed in the sub-area SR, the panel bending area BD, and the main area MR. The signal wires SL may extend from the sub-area SR to the main area MR via the panel bending area BD. Some of the signal wires SL (e.g., a first power supply wire and a second power supply wire) may extend from the end of the sub-area SR to the panel bending area BD without via the driving chip 20 and may extend to the main area MR. The other signal wires SL (e.g., data lines DL) may extend from the end of the sub-area SR to the panel bending area BD via the driving chip 20 and may extend to the main area MR. The signal wires SL passing through the driving chip 20 may form a fan-out structure that spreads wider from the sub-area SR and/or the panel bending area BD toward the main area MR in order to substantially cover the main area MR, which is wider than the driving chip 20. The signal wires SL not passing through the driving chip 20 may extend outside of the signal wires SL passing through the driving chip 20.

The signal wires SL passing through the panel bending area BD may be subjected to bending stress because they are bent in accordance with the bending of the display panel 10. The bending stress may cause cracking or breaking of the signal wires SL. To prevent this, the signal wires SL passing through the panel bending area BD may be made of a more flexible material. The signal wires SL passing through the panel bending area BD may include a plurality of wire layers electrically connected and contacted perpendicularly. The signal wires SL passing through the panel bending area BD may have a multi-path structure; even if one of the wire layers is broken, a signal can still be transmitted through another wire layer electrically connected to the wire layer.

Contact areas CT1 and CT2 may be disposed adjacent to the panel bending area BD. For example, a first contact area CT1 may be disposed in the sub-area SR adjacent to the panel bending area BD or at a boundary between the sub-area SR and the panel bending area BD, and a second contact area CT2 may be disposed in the main area MR adjacent to the panel bending area BD or at a boundary between the panel bending area BD and the main area MR.

Figure 4:
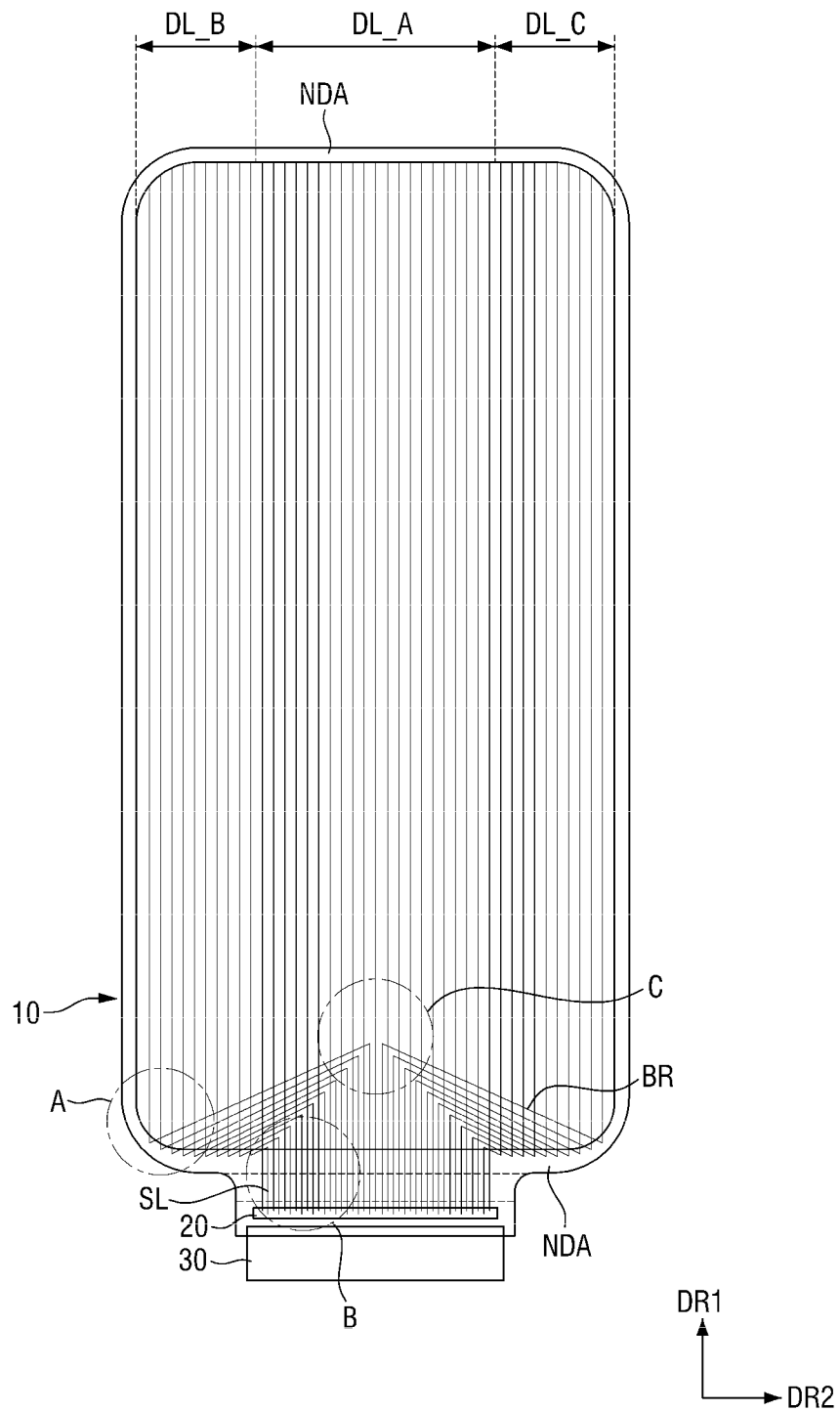
FIG. 4 is a plan/layout view of signal wires of a display panel according to an embodiment.
Figure 6:
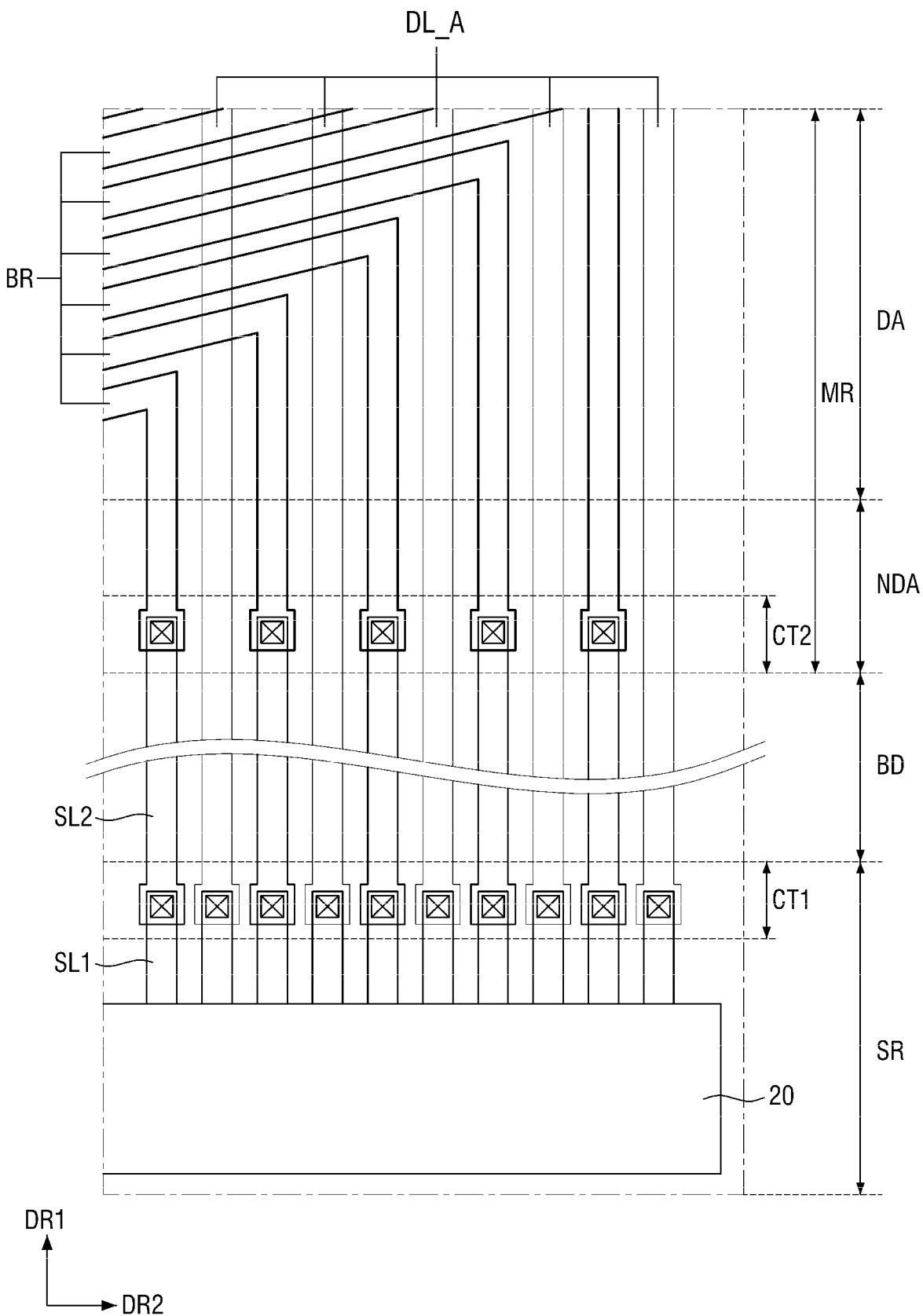
FIG. 6 is an enlarged view of an area B of FIG. 4 according to an embodiment.

The signal wires SL traversing at least a part of the panel bending area BD may transfer to different wire layers as they pass through the first contact area CT1 and the second contact area CT2. Referring to FIG. 3, FIG. 4, and FIG. 6, the signal wires SL may include first signal wires SL1 which are located in the sub-area SR and made of (or located at) a first wire layer and may include second signal wires SL2 which are located in the main area MR and made of (located at) a second wire layer.

Figure 5:
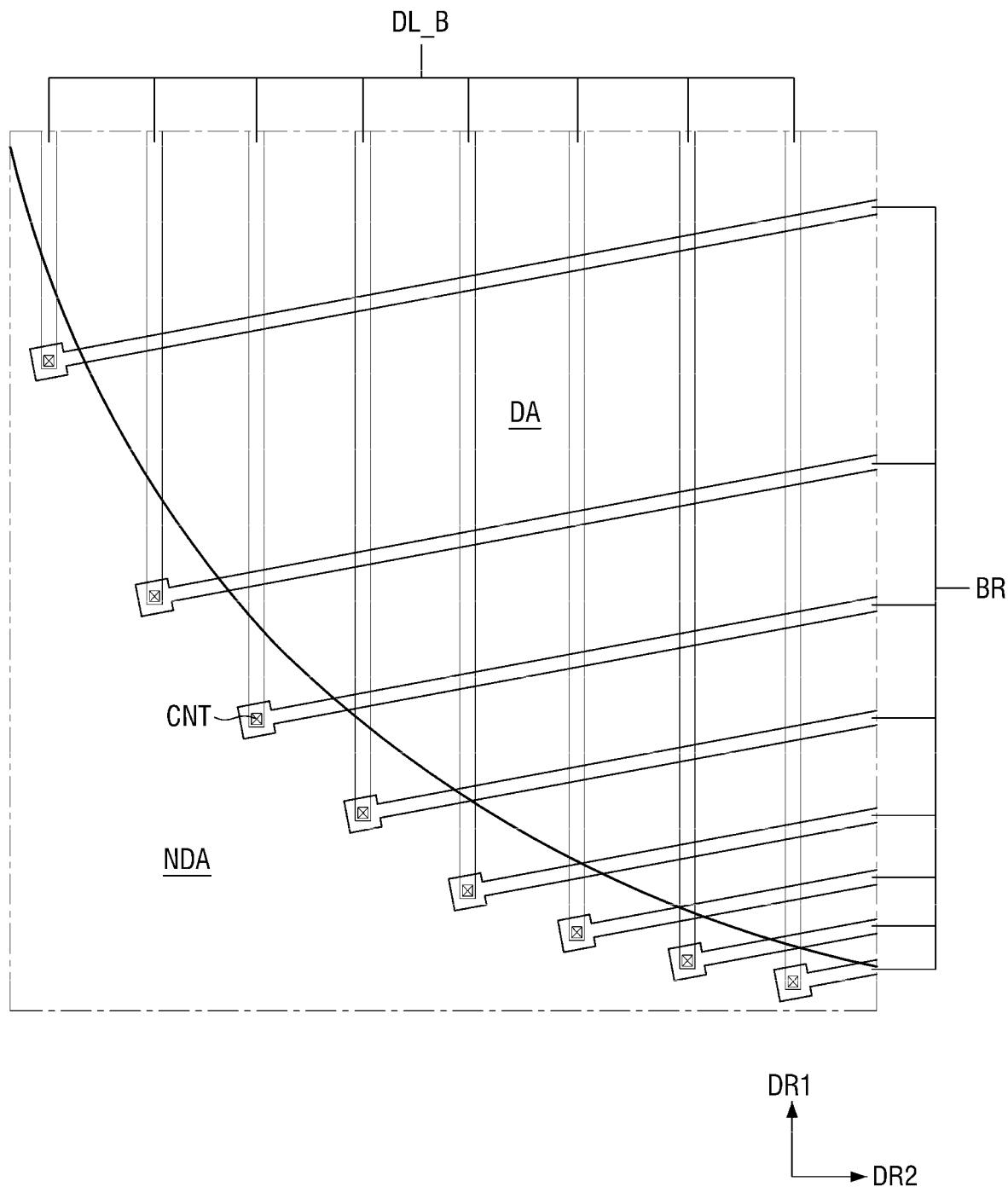
FIG. 5 is an enlarged view of an area A of FIG. 4 according to an embodiment.
Figure 7:
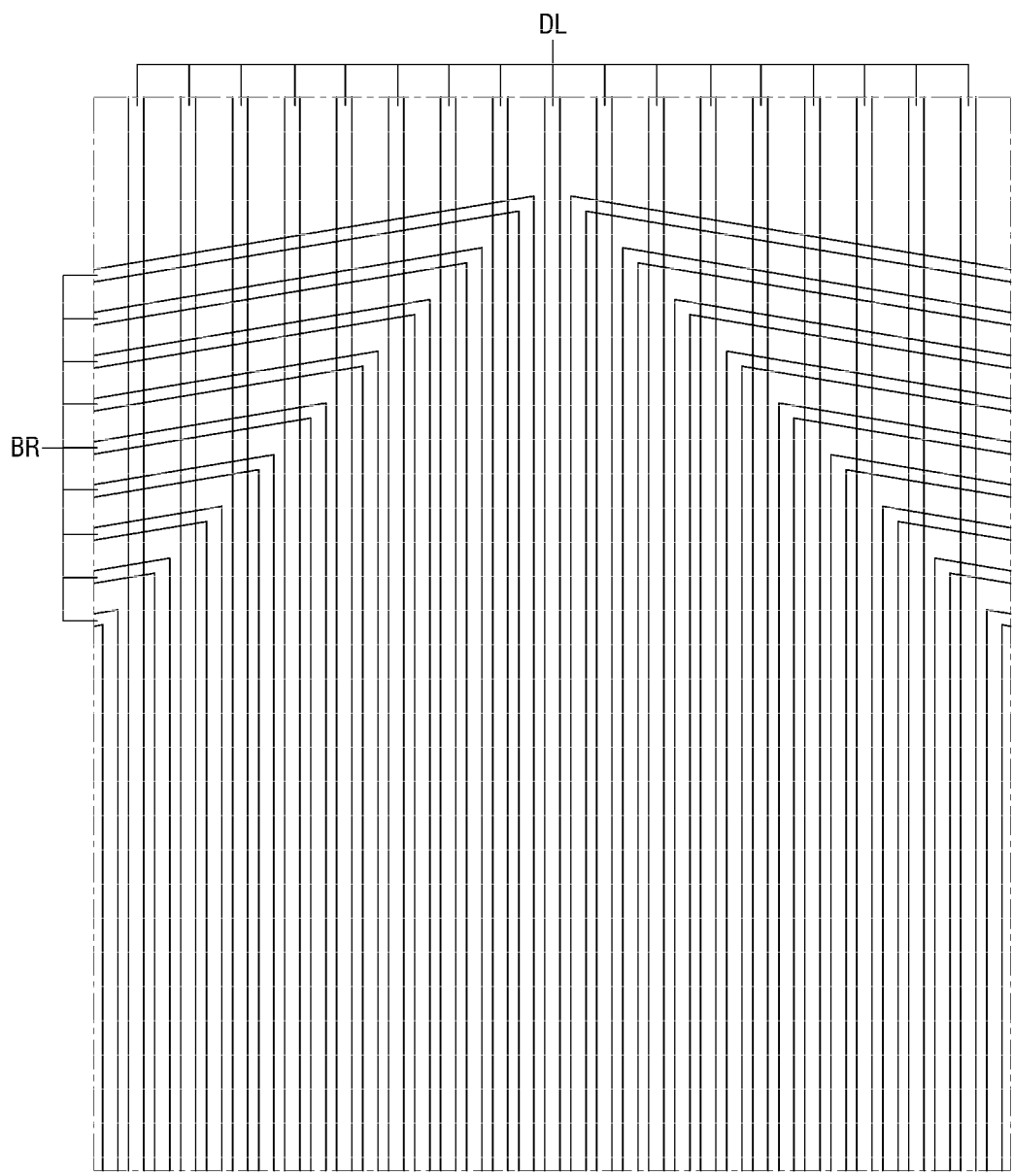
FIG. 7 is an enlarged view of an area C of FIG. 4 according to an embodiment.

FIG. 4 is a plan/layout view of signal wires SL of the display panel 10 according to an embodiment. FIG. 5 is an enlarged view of an area A of FIG. 4 according to an embodiment. FIG. 6 is an enlarged view of an area B of FIG. 4 according to an embodiment. FIG. 7 is an enlarged view of an area C of FIG. 4 according to an embodiment.

Referring to FIGS. 4 through 7, the display device 1 may include data lines DL, connecting wires BR, and the signal wires SL. The arrangement of the data lines DL, the connecting wires BR, and the signal wires SL may be symmetrical with respect to a reference axis (not illustrated) extending in a first direction DR1 and passing through the center of the area of the display device 1.

The data lines DL may extend in the first direction DR1 and may be arranged along a second direction D2 at predetermined intervals. Each of the data lines DL may extend across the display area DA in the first direction DR1.

The data lines DL may include first data lines DL_A directly connected to signal wires SL and may include second data lines DL_B and DL_C connected to signal wires SL through connecting wires BR. The first data lines DL_A may be disposed in a region of the display area DA which coincides with the width of the driving chip 20 in the second direction DR2. The second data lines DL_B and DL_C may be disposed in regions of the display area DA outside the width of the driving chip 20 in the second direction DR2. That is, the second data lines DL_B and DL_C may be disposed on left and right sides of the first data lines DL_A.

The connecting wires BR may electrically connect some of the data lines DL to some of the signal wires SL. The connecting wires BR may be disposed in a layer different from a layer where the data lines DL are disposed and may be insulated from the data lines DL by an insulating layer.

The connecting wires BR may be disposed in a fan-out structure in the display area DA. The horizontal width of the display panel 10 may be greater than the horizontal width of the driving chip 20. The connecting wires BR may form a fan-out structure that spreads wider from the display area DA toward the non-display area NDA in order to connect to the second data lines DL_B and DL_C.

Sections of the connecting wires BR may extend in the first direction DR1 in spaces between the first data lines DL_A and may be arranged at regular intervals along the second direction DR2. Connecting wires BR may extend more in the first direction DR1 from a left end toward the center with respect to the driving chip 20 and may extend more in the first direction DR1 from a right end toward the center with respect to the driving chip 20.

Connecting wires BR located at the center with respect to the driving chip 20 may extend obliquely toward data lines DL disposed on the left side among the second data lines DL_B. Connecting wires BR located on the left side with respect to the driving chip 20 may extend obliquely toward data lines DL disposed on the right side among the second data lines DL_B. Connecting wires BR located at the center with respect to the driving chip 20 may extend obliquely toward data lines DL disposed on the right side among the second data lines DL_C. Connecting wires BR located on the right side with respect to the driving chip 20 may extend obliquely toward data lines DL disposed on the left side among the second data lines DL_C. The connecting wires BR may collectively form an arrow shape in a plan view of the display panel 10.

The display area DA includes a plurality of pixels electrically connected to the data lines DL. The display area DA may have a substantially rectangular planar shape and/or another shape.

The display area DA may have four sides, i.e., an upper side, a lower side, a left side, and a right side and may have four corners disposed between adjacent sides. The upper and lower sides may be parallel to each other, and the left and right sides may be parallel to each other. The upper and lower sides may extend perpendicularly to the left and right sides, but the corners at which the upper and lower sides meet the left and right sides may not be right-angled, e.g., may be inclined. An internal angle of each corner may be larger than 90 degrees. Each corner may be shaped like an inclined straight line, but may also have a rounded, curved shape.

Referring to FIG. 5, a corner where the left side and the lower side of the display area DA meet may have a rounded, curved shape. The connecting wires BR and the data lines DL may be connected to each other outside the display area DA through contact holes CNT. When the display area DA has rounded, curved corners, intervals between immediately neighboring contact holes CNT (through which the connecting wires BR and the data lines DL are connected) may be equal in the second direction DR2, but may gradually increase toward an edge of the display panel 10 (e.g., the left edge of the display panel 10) in the first direction DR1.

Since the connecting wires BR and the data lines DL are connected in the non-display area. NDA through the contact holes CNT, unwanted coupling with other conductors may not occur.

Referring to FIGS. 6 and 7, the driving chip 20 may be disposed in the sub-area SR, and the first signal wires SL1 electrically connected to the driving chip 20 may extend in the first direction DR1 at equal intervals in the sub-area SR. The first signal wires SL1 may be located in the same wire layer as the driving chip 20. The first signal wires SL1 may include a metal such as copper (Cu), molybdenum (Mo), or an alloy.

The second signal wires SL2 may contact some of the first signal wires SL1 through contact holes CNT in the first contact area C1. The second signal wires SL2 may extend along the first direction DR1 at equal intervals in the panel bending area BD.

The first data lines DL_A may contact some of the first signal wires SL1 through contact hole CNT in the first contact area C1. The first data lines DL_A may extend along the first direction DR1 from the panel bending area BD to the main area MR at equal intervals.

The first data lines DL_A and the second signal wires SL2 may be located in the same wire layer and may include a flexible material such as aluminum (Al) and/or may include a stacked structure of titanium-aluminum-titanium (Ti—Al—Ti).

The connecting wires BR may contact the second signal wires SL2 through contact holes CNT in the second contact area C2 located in the non-display area NDA. Sections of the connecting wires BR may extend in the first direction DR1 in the non-display area NDA and to specific positions in the display area DA. The connecting wires BR may be bent to the left and/or downward at the specific positions in the display area DA. Sections of the connecting wires BR may extend obliquely from the specific positions. The connecting wires BR may be located in a wire layer different from the wire layer of the second signal wires SL2 and may include a flexible material such as aluminum (Al) and/or may include a stacked structure of titanium-aluminum-titanium (Ti—Al—Ti).

Figure 8:
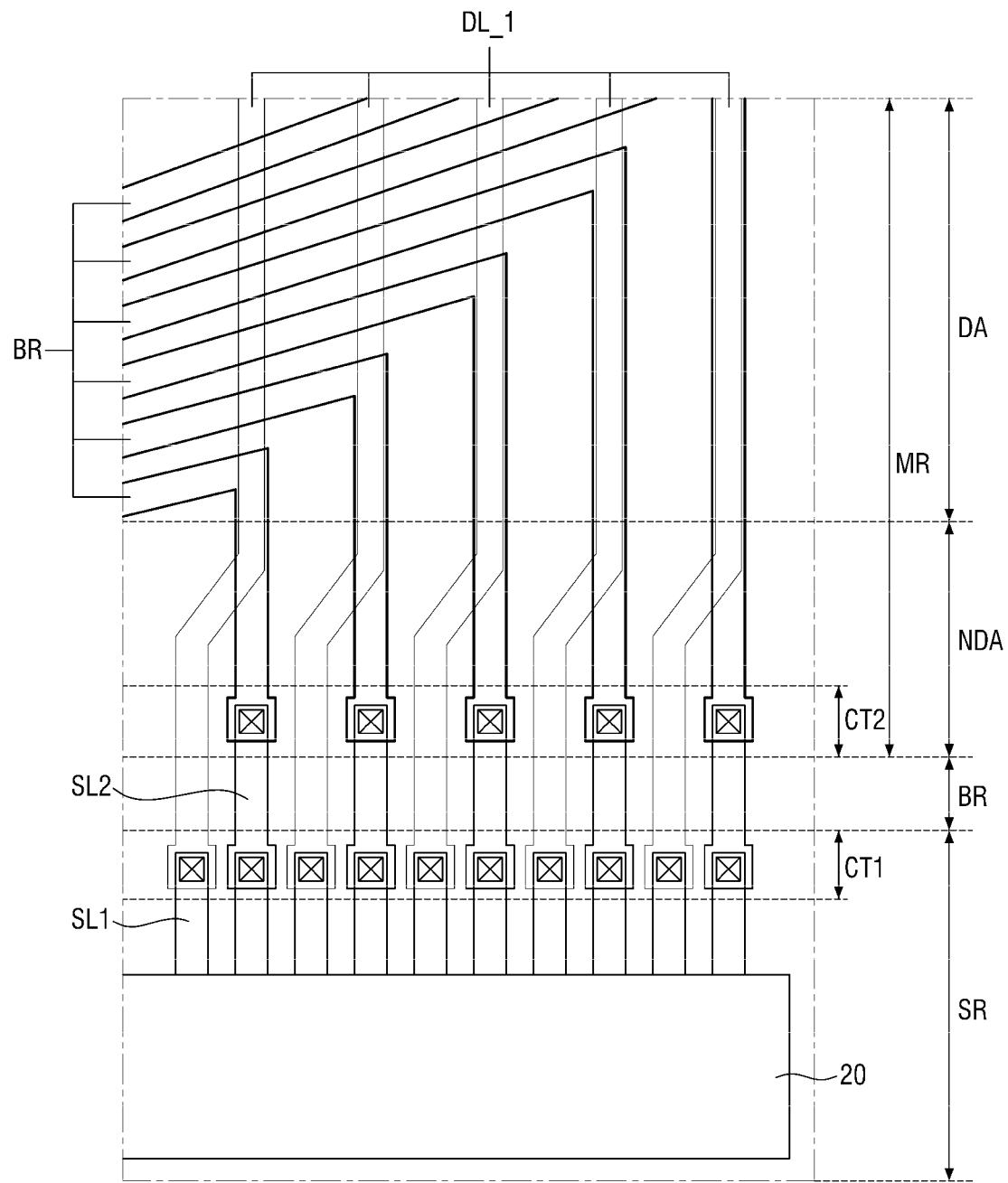
FIG. 8 is an enlarged view of the area B of FIG. 4 according to an embodiment.

FIG. 8 is an enlarged view of the area B of FIG. 4 according to an embodiment.

Referring to FIG. 8, sections of first data lines DL_1 may overlap sections of connecting wires BR in some sections of a main area MR.

Sections of the first data lines DL_1 may extend parallel to second signal wires SL2 and the connecting wires BR from a sub-area SR to a panel bending area BD. A pitch of each first data line DL_1 may be defined as the sum of a width of the first data line DL_1 and a gap between two immediately neighboring data lines. When the pitch of each first data line DL_1 has a small value, sections of the first data lines DL_1 may overlap sections of the connecting wires BR from a non-display area NDA to specific positions in a display area DA.

The connecting wires BR may be disposed in a layer different from a layer where the first data lines DL_1 are disposed and may be insulated from the first data lines DL_1 by an insulating layer. The insulating layer may include an organic insulating material such as polyacrylics resin or polyimides resin. The organic insulating layer may have a thickness of at least about 15000 Å; therefore, unwanted coupling due to overlapping of the connecting wires BR and the first data lines may be minimized or prevented.

Pixels are formed on a substrate 110 of the display device 1 are electrically connected to the data lines DL.

Figure 9:
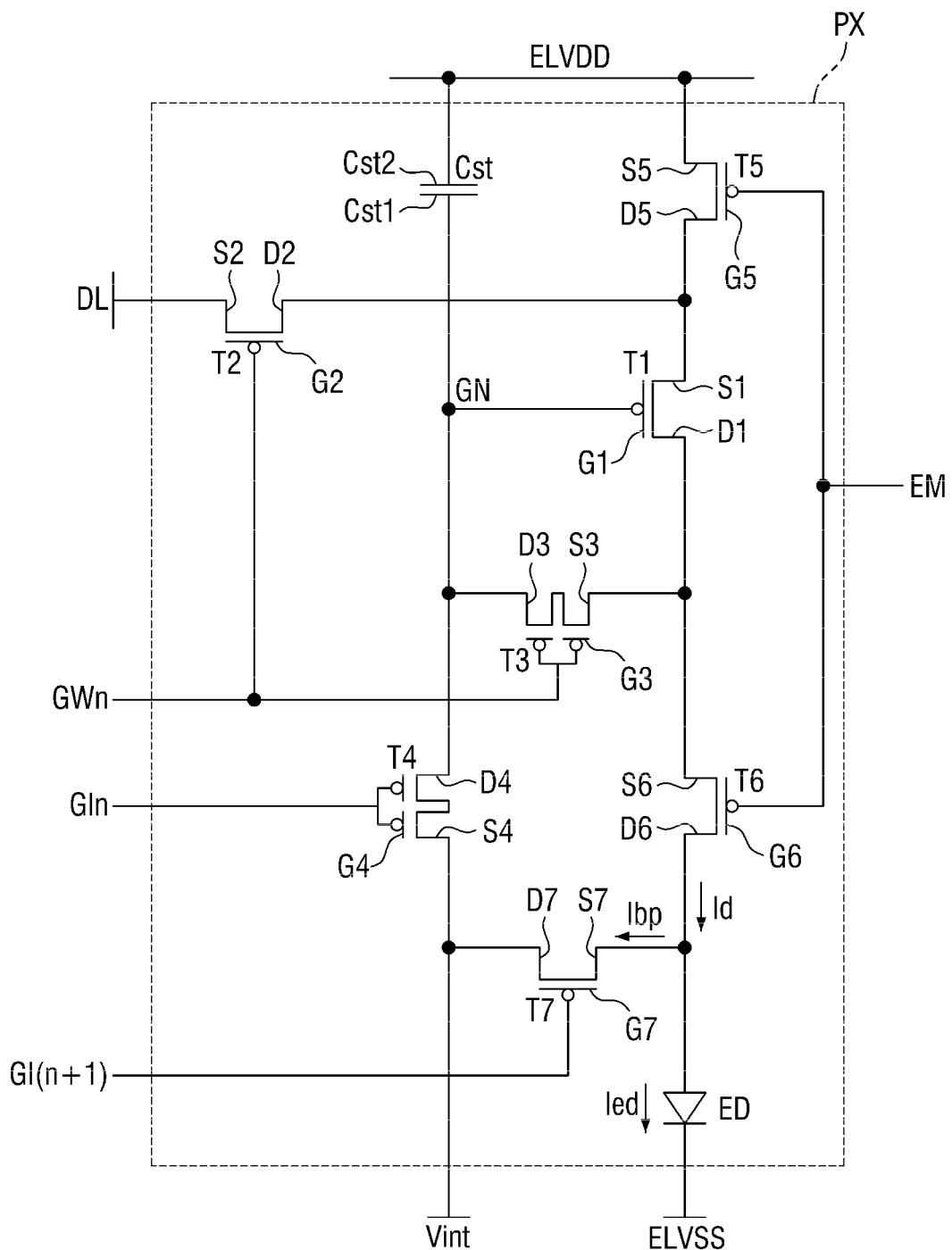
FIG. 9 is an equivalent circuit diagram of a pixel of the display device according to an embodiment.

FIG. 9 is an equivalent circuit diagram of a pixel PX of the display device 1 according to the embodiment.

Referring to FIG. 9, the display device 1 includes a plurality of pixels PX capable of displaying an image according to an image signal; the display device includes a plurality of signal lines GWn, GIn, EM, GI(n+1), DL and ELVDD connected to the pixels. One pixel PX may include a plurality of transistors T1, T2, T3, T4, T5, T6, and T7 connected to the signal lines GWn, GIn, EM, GI(n+1), DL and ELVDD, a capacitor Cst, and at least one light emitting diode ED. The signal lines GWn, GIn, EM, GI(n+1), DL and ELVDD may include a plurality of scan lines GWn, Gin and GI(n+1), a plurality of control lines EM, a plurality of data lines DL, and a plurality of driving voltage lines ELVDD.

The scan lines GWn, GIn and GI(n+1) may transmit scan signals GWn, GIn, and GI(n+1), respectively. The scan signals GWn, GIn and GI(n+1) may carry a gate-on voltage and a gate-off voltage that can turn on/off the transistors T2, T3, T4 and T7 included in each pixel PX.

The scan lines GWn, GIn and GI(n+1) connected to one pixel PX may include a first scan line GWn which can transmit a scan signal, a second scan line GIn which can transmit a scan signal GIn having a gate-on voltage at a different time from the first scan line GWn, and a third scan line GI(n+1) which can transmit a scan signal GI(n+1). In the current embodiment, an example in which the second scan line GIn transmits a gate-on voltage at a time earlier than the first scan line GWn will be mainly described. For example, when a scan signal is an $n^{th}$ scan signal Sn (where n is a natural number equal to or greater than 1) among scan signals transmitted during one frame, the scan signal GIn may be a previous scan signal such as an $(n-1)^{th}$ scan signal S(n-1), and the scan signal GI(n+1) may be the $n^{th}$ scan signal Sn. However, the scan signal GI(n+1) may also be a scan signal other than the $n^{th}$ scan signal Sn.

The control lines EM may transmit control signals, in particular, emission control signals capable of controlling the light emission of the light emitting diodes ED included in the pixels PX. The control signals transmitted by the control lines EM may carry a gate-on voltage and a gate-off voltage and may have different waveforms from scan signals transmitted by the scan lines GWn, GIn and GI(n+1).

The data lines DL may transmit data signals, and the driving voltage lines ELVDD may transmit driving voltages. The data signals may have a different voltage level according to an image signal input to the display device 1, and the driving voltages may have a substantially constant level.

The transistors T1 through T7 may include a first transistor T1, a second transistor T2, a third transistor T3, a fourth transistor T4, a fifth transistor T5, a sixth transistor T6, and a seventh transistor T7.

In one pixel PX, the first scan line GWn may transmit a scan signal to the second transistor T2 and the third transistor T3, and the second scan line GIn may transmit the scan signal GIn to the fourth transistor T4, the third scan line GI(n+1) may transmit the scan signal GI(n+1) to the seventh transistor T7, and the control line EM may transmit an emission control signal EM to the fifth transistor T5 and the sixth transistor T6.

A gate electrode G1 of the first transistor T1 is connected to a first end Cst1 of the capacitor Cst through a driving gate node GN, a source electrode S1 of the first transistor T1 is connected to the driving voltage line ELVDD via the fifth transistor T5, and a drain electrode D1 of the first transistor T1 is electrically connected to an anode of the light emitting diode ED via the sixth transistor T6. The first transistor T1 may receive a data signal from the data line DL according to a switching operation of the second transistor T2 and supply a driving current Id to the light emitting diode ED.

A gate electrode G2 of the second transistor T2 is connected to the first scan line GWn, and a source electrode S2 of the second transistor T2 is connected to the data line DL. In addition, a drain electrode D2 of the second transistor T2 is connected to the source electrode S1 of the first transistor T1 and connected to the driving voltage line ELVDD via the fifth transistor T5. The second transistor T2 may be turned on in response to a scan signal received through the first scan line GWn and transmit a data signal received from the data line DL to the source electrode S1 of the first transistor T1.

A gate electrode G3 of the third transistor T3 is connected to the first scan line GWn, and a source electrode S3 of the third transistor T3 is connected to the drain electrode D1 of the first transistor T1 and connected to the anode of the light emitting diode ED via the sixth transistor T6. A drain electrode D3 of the third transistor T3 is connected to a drain electrode D4 of the fourth transistor T4, the first end Cst1 of the capacitor Cst and the gate electrode G1 of the first transistor T1. The third transistor T3 may be turned on in response to a scan signal received through the first scan line GWn and diode-connect the first transistor T1 by connecting the gate electrode G1 and the drain electrode D1 of the first transistor T1.

A gate electrode G4 of the fourth transistor T4 is connected to the second scan line GIn, a source electrode S4 of the fourth transistor T4 is connected to an initialization voltage terminal Vint, and the drain electrode D4 of the fourth transistor T4 is connected to the first end Cst1 of the capacitor Cst and the gate electrode G1 of the first transistor T1 via the drain electrode D3 of the third transistor T3. The fourth transistor T4 may be turned on in response to the scan signal GIn received through the second scan line GIn and initialize a voltage of the gate electrode G1 of the first transistor T1 by transmitting an initialization voltage Vint to the gate electrode G1 of the first transistor T1.

A gate electrode G5 of the fifth transistor T5 is connected to the control line EM, a source electrode S5 of the fifth transistor T5 is connected to the driving voltage line ELVDD, and a drain electrode D5 of the first transistor T5 is connected to the source electrode S1 of the first transistor T1 and the drain electrode D2 of the second transistor T2.

A gate electrode G6 of the sixth transistor T6 is connected to the control line EM, a source electrode S6 of the sixth transistor T6 is connected to the drain electrode D1 of the first transistor T1 and the source electrode S3 of the third transistor T3, and a drain electrode D6 of the sixth transistor T6 is electrically connected to the anode of the light emitting diode ED. The fifth transistor T5 and the sixth transistor 16 are simultaneously turned on in response to the emission control signal EM received through the control line EM. Accordingly, a driving voltage may be compensated by the diode-connected first transistor T1 and transmitted to the light emitting diode ED.

A gate electrode G7 of the seventh transistor T7 is connected to the third scan line GI(n+1), a source electrode S7 of the seventh transistor T7 is connected to the drain electrode D6 of the sixth transistor T6 and the anode of the light emitting diode ED, and a drain electrode D7 of the seventh transistor T7 is connected to the initialization voltage terminal Vint and the source electrode S4 of the fourth transistor T4. Alternatively, the gate electrode G7 of the seventh transistor T7 may be connected to a separate control line (not illustrated).

The transistors T1 through T7 may be P-channel transistors such as P-channel metal oxide semiconductor (PMOS) transistors. At least one of the transistors T1 through T7 may also be an N-channel transistor.

The first end Cst1 of the capacitor Cst is connected to the gate electrode G1 of the first transistor T1 as described above, and a second end Cst2 is connected to the driving voltage line ELVDD. A cathode of the light emitting diode ED may be connected to a common voltage terminal ELVSS for transmitting a common voltage ELVSS and receive the common voltage ELVSS.

The structure of one pixel PX according to an embodiment is not limited to the structure illustrated in FIG. 9, and the number of transistors and the number of capacitors included in one pixel PX and the connection relationships can be variously modified.

The operation of the display device 1 according to the embodiment will now be described with reference to FIG. 10, together with FIG. 9 described above. Here, an example in which the transistors T1 through T7 are P-channel transistors will be described, and the operation of the display device 1 during one frame will be described.

Figure 10:
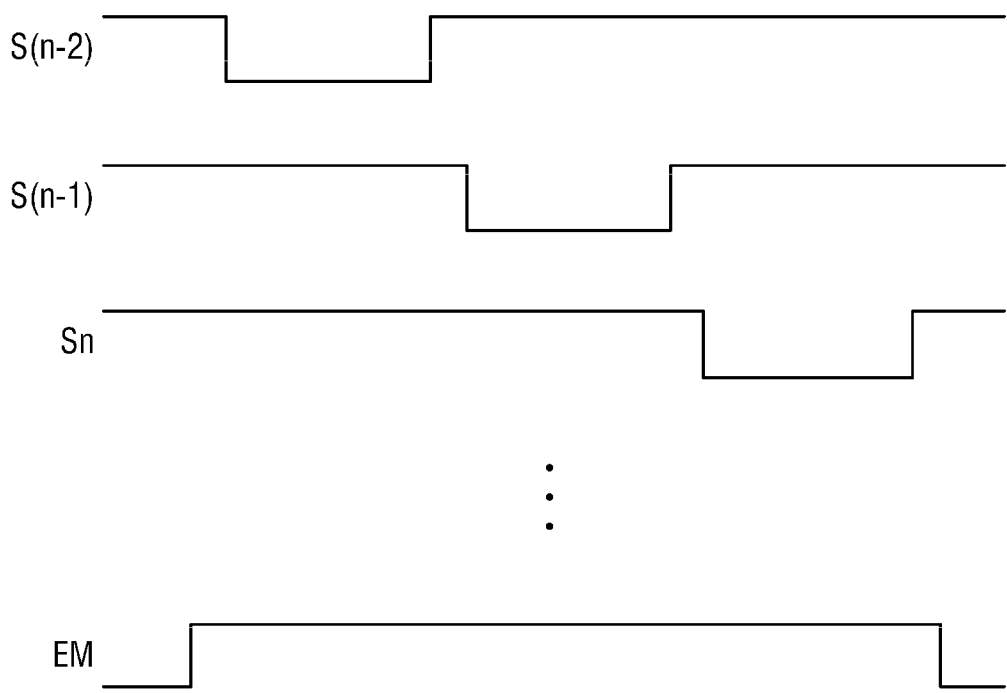
FIG. 10 is a timing diagram of driving signals of the display device according to an embodiment.

FIG. 10 is a timing diagram of driving signals of the display device 1 according to the embodiment.

Referring to FIG. 10, in one frame, scan signals . . . , S(n−2), S(n−1), Sn, . . . at a low level may be sequentially transmitted to a plurality of first scan lines GWn connected to a plurality of pixels PX.

During an initialization period, the scan signal GIn at a low level is supplied through the second scan line GIn. The scan signal GIn may be, for example, the $(n-1)^{th}$ scan signal S(n−1). The fourth transistor T4 is turned on in response to the scan signal GIn at the low level. The initialization voltage Vint is connected to the gate electrode G1 of the first transistor T1 through the fourth transistor T4, and the first transistor T1 is initialized by the initializing voltage Vint.

Next, when a scan signal at a low level is supplied through the first scan line GWn during a data programming and compensation period, the second transistor T2 and the third transistor T3 are turned on in response to the scan signal at the low level. The scan signal may be, for example, the $n^{th}$ scan signal Sn. At this time, the first transistor T1 is diode-connected by the turned-on third transistor T3 and is biased in a forward direction. Then, a compensation voltage DL+Vth (where Vth has a negative (−) value) reduced by a threshold voltage Vth of the first transistor T1 from a data signal supplied from the data line DL is applied to the gate electrode G1 of the first transistor T1. That is, a gate voltage applied to the gate electrode G1 of the first transistor T1 may be the compensation voltage DL+Vth.

A driving voltage and the compensation voltage DL+Vth may be applied to both ends of the capacitor Cst, and a charge corresponding to a voltage difference between the both ends may be stored in the capacitor Cst.

Next, the emission control signal EM supplied from the control line EM is changed from a high level to a low level during an emission period. The time when the emission control signal EM is changed from a high level to a low level may be after scan signals are transmitted to all first scan lines GWn in one frame. The fifth transistor T5 and the sixth transistor T6 are turned on by the emission control signal EM at the low level during the emission period. Then, the driving current Id corresponding to a difference between the gate voltage of the gate electrode G1 of the first transistor T1 and the driving voltage is generated. The driving current Id is supplied to the light emitting diode ED through the sixth transistor T6. As a result, a current Ied flows through the light emitting diode ED. During the emission period, a gate-source voltage Vgs of the first transistor T1 is maintained at (DL+Vth)-ELVDD by the capacitor Cst. According to the current-voltage relationship of the first transistor T1, the driving current Id may be proportional to the square (DL-ELVDD)$^2$ of a value obtained by subtracting the threshold voltage Vth from the gate-source voltage Vgs. Therefore, the driving current Id may be determined regardless of the threshold voltage Vth of the first transistor T1.

During the initialization period, the seventh transistor T7 is turned on in response to the scan signal GI(n+1) at a low level received through the third scan line GI(n+1). The scan signal GI(n+1) may be the n$^{th}$ scan signal Sn. In this case, the seventh transistor T7 may be turned on at the same time as the second and third transistors T2 and T3. A portion of the driving current Id may flow out as a bypass current Ibp through the turned-on seventh transistor T7.

Figure 11:
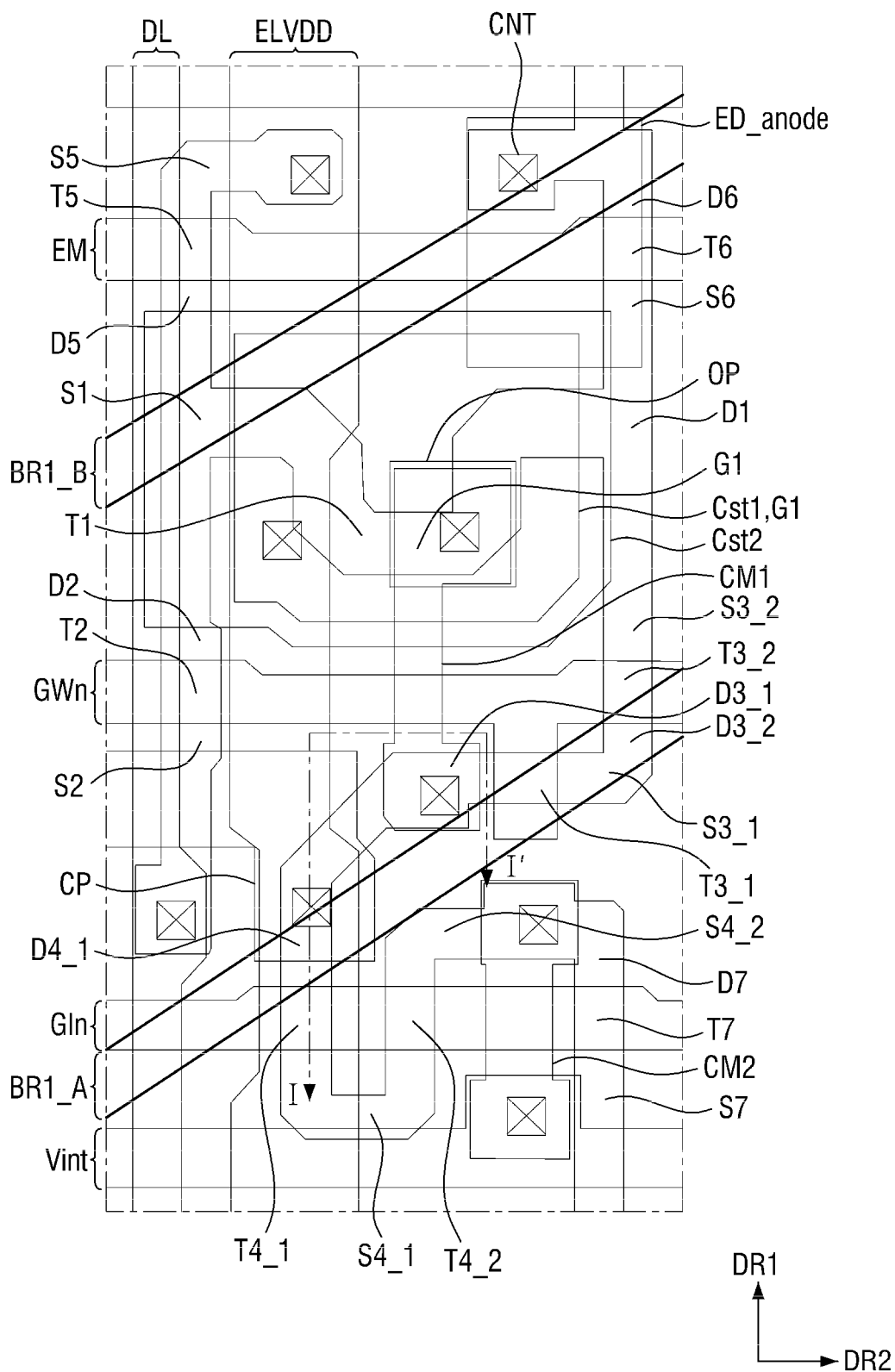
FIG. 11 is a plan view of a pixel overlapping oblique sections of connecting wires according to an embodiment.
Figure 12:
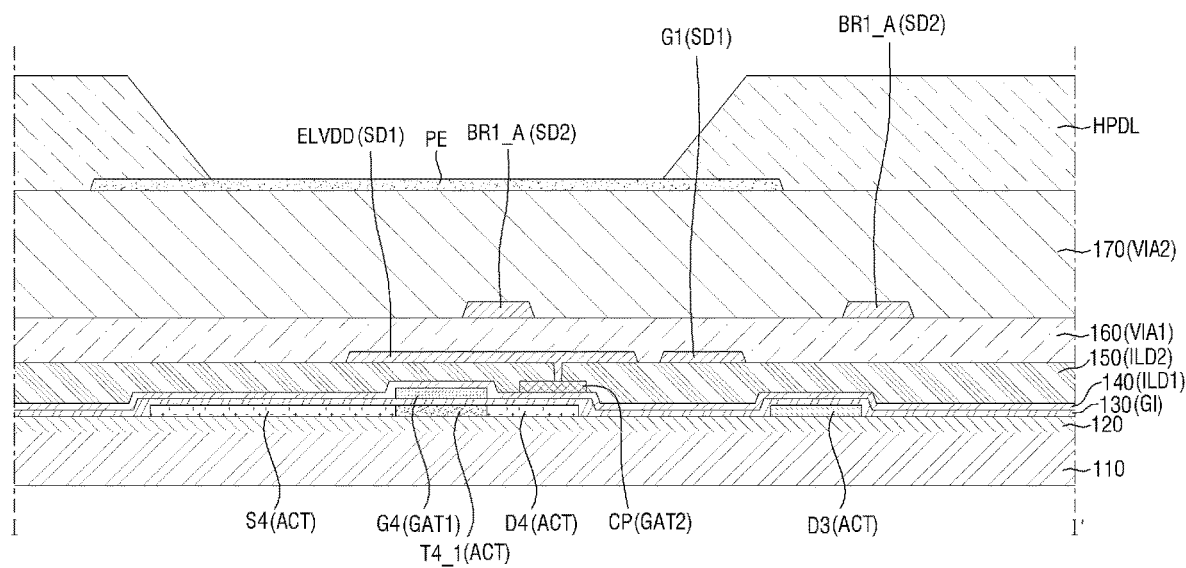
FIG. 12 is a cross-sectional view taken along line I-I' of FIG. 11 according to an embodiment.
Figure 13:
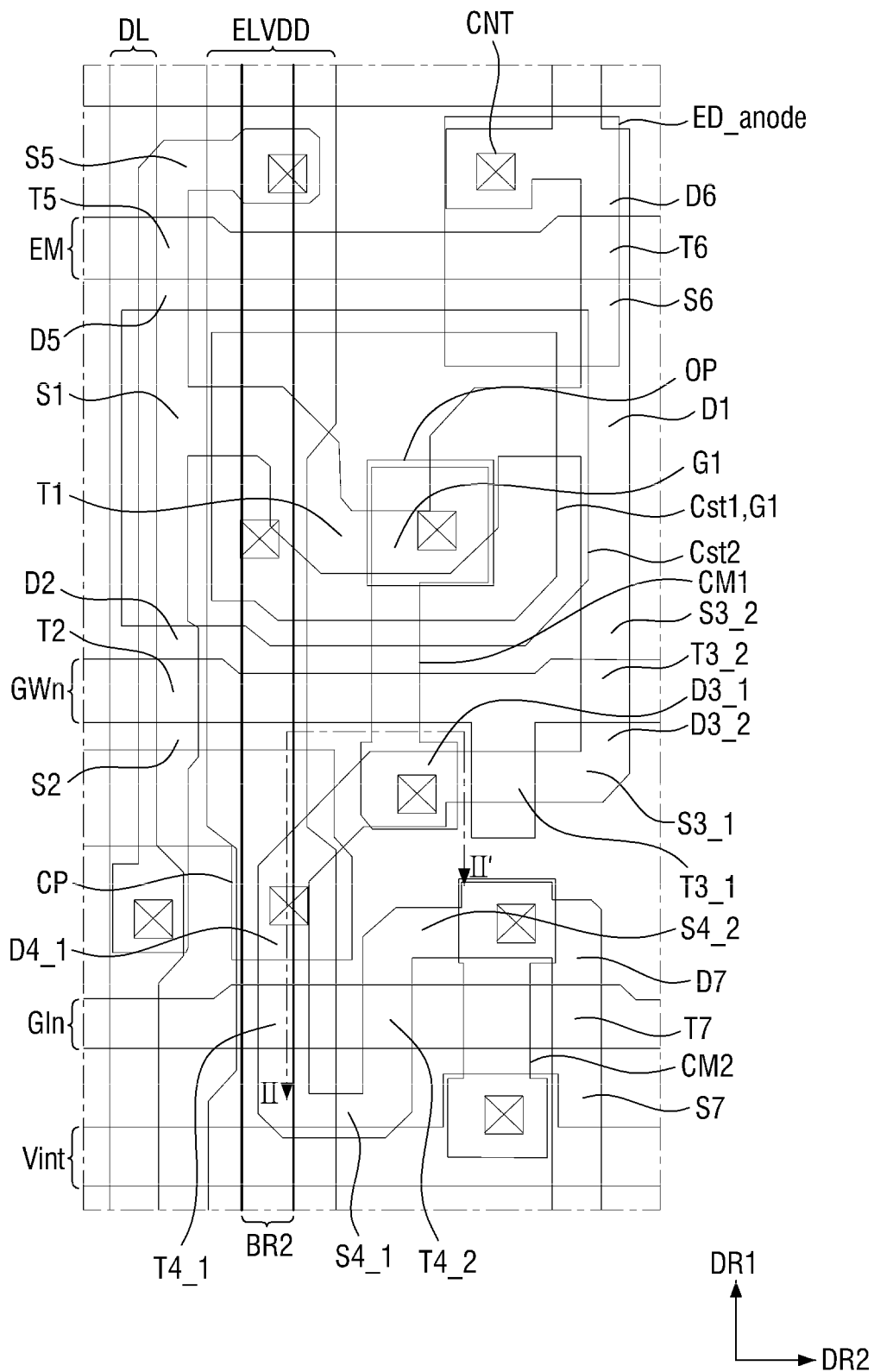
FIG. 13 is a plan view of a pixel overlapping a vertical section of a connecting wire according to an embodiment.
Figure 14:
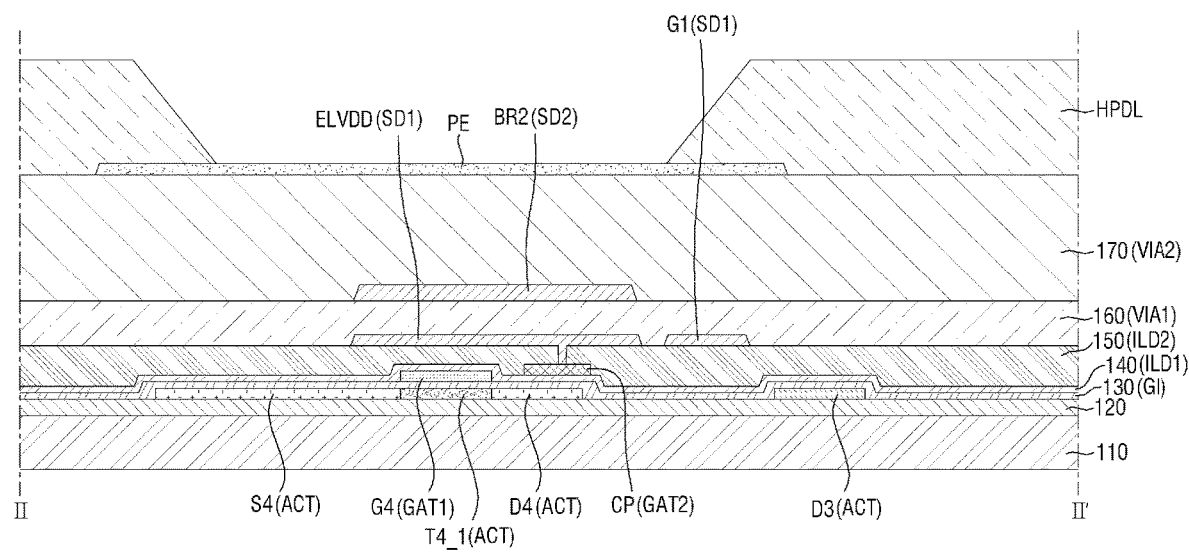
FIG. 14 is a cross-sectional view taken along line II-II' of FIG. 13 according to an embodiment.

FIG. 11 is a plan view of a pixel overlapping oblique sections of connecting wires according to an embodiment, and FIG. 12 is a cross-sectional view taken along line I-I' of FIG. 11 according to an embodiment. FIG. 13 is a plan view of a pixel overlapping a vertical section of a connecting wire according to an embodiment, and FIG. 14 is a cross-sectional view taken along line II-II' of FIG. 13 according to an embodiment.

Pixels PX included in the display device 1 may display different colors. The pixels PX may include, for example, a red pixel capable of displaying red, a green pixel capable of displaying green, and a blue pixel capable of displaying blue. In an embodiment, at least one of the red pixel, the green pixel, and the blue pixel may display a different color. In an embodiment, pixels capable of displaying colors other than red, green, and blue may be provided.

Referring to FIG. 9, FIG. 11, FIG. 12, FIG. 13, and FIG. 14, the display device 1 may include a first conductive layer GAT1 including a first scan line GWn for transmitting a first scan signal, a second scan line GIn for transmitting a second scan signal, and a control line EM for transmitting an emission control signal. The first conductive layer GAT1 may be located on a surface of a substrate 110, may include and/or may be formed of the same material as other conductors of the first conductive layer GAT1, and may be located on the same layer as other conductors of the first conductive layer GAT1.

The substrate 110 may include an inorganic or organic insulating material such as glass or plastic and may have one or more of various degrees of flexibility.

A plurality of scan lines, including GWn, GIn, and GI(n+1) (shown in FIG. 9), and the control line EM may extend substantially along the second direction DR2 in a plan view of the display device 1. The first scan line GWn may be located between the second scan line GIn and the control line EM in a plan view of the display device 1. A third scan line GI(n+1) may transmit a third scan signal GI(n+1) subsequent to the second scan signal transmitted by the second scan line GIn. When the first scan line GWn transmits an (n-2)$^{th}$ scan signal S(n-2), the third scan line GI(n+1) may also transmit the n$^{th}$ scan signal Sn.

The display device 1 may further include a second conductive layer GAT2 including a second end Cst2 of a capacitor Cst (shown in FIG. 9) and an initialization voltage line Vint. The second conductive layer GAT2 is spaced from the first conductive layer GAT1. For example, the second conductive layer GAT2 may be located over the first conductive layer GAT1.

The second electrode Cst2 of the capacitor Cst and the initialization voltage line Vint may extend substantially along the second direction DR2 in a plan view of the display device 1. The second end Cst2 of the capacitor Cst may be located between the first scan line GWn and the control line EM in the plan view of the display device 1. The second end Cst2 of the capacitor Cst may be connected to a driving voltage line ELVDD through a contact hole CNT so as to receive a driving voltage. A storage opening OP may be formed in the second end Cst2 of the capacitor Cst.

The initialization voltage line Vint may transmit an initialization voltage and may be located below the second scan line GIn in a plan view of the display device 1. However, the position of the initialization voltage line Vint is not limited to this position.

The display device 1 may further include a third conductive layer SD1 including a data line DL for transmitting a data signal and including the driving voltage line ELVDD for transmitting a driving voltage. The third conductive layer SD1 is spaced from each of the first conductive layer and the second conductive layer. For example, the third conductive layer SD1 may be located over the second conductive layer GAT2.

The data line DL and the driving voltage line ELVDD may extend substantially in the first direction DR1 in a plan view of the display device 1 and may intersect the scan lines GWn and GIn, the control line EM, the initialization voltage line Vint and the second end Cst2 of the capacitor Cst.

Each pixel PX may include transistors T1 through T7 which are connected to the scan lines GWn and GIn, the control line EM, the data line DL and the drive voltage line ELVDD, the capacitor Cst, and a light emitting diode ED.

A channel of each of the transistors T1 through T7 in one pixel PX may be formed inside one active pattern ACT, and the active pattern ACT may be bent in various shapes. The active pattern ACT may include a semiconductor material such as polycrystalline silicon or an oxide semiconductor.

The active pattern ACT may be located between the substrate 110 and the first conductive layer GAT1 in cross section.

The active pattern ACT includes channel regions T1, T2, T3_1, T3_2, T4_1, T4_2, T5, T6 and T7 which respectively form the channels of the transistors T1 through T7 and conductive regions. In particular, the third transistor T3 and the fourth transistor T4 may have a dual-gate structure, in this case, the third transistor T3 may include two channel regions T3_1 and T3_2, and the fourth transistor T4 may include two channel regions T4_1 and T4_2.

The conductive regions of the active pattern ACT are located on both sides of each of the channel regions T1, T2, T3_1, T3_2, T4_1, T4_2, T5, T6 and T7 and have a higher carrier concentration than the channel regions T1, T2, T3_1, T3_2, T4_1, T4_2, T5, T6 and T7. The most of the portions of the active pattern ACT excluding the channel regions T1, T2, T3_1, T3_2, T4_1, T4_2, T5, T6 and T7 may be the conductive regions. A pair of conductive regions located on both sides of each of the channel regions T1, T2, T3_1, T3_2, T4_1, T4_2, T5, T6 and T7 of the transistors T1 through T7 may be source and drain regions of each of the transistors T1 through T7 and may function as a source electrode and a drain electrode, respectively.

The first transistor T1 includes a channel region T1, a source region S1 and a drain region D1 which are conductive regions of the active pattern ACT located on both sides of the channel region T1, and a driving gate electrode G1 which overlaps the channel region T1 in a plan view of the display device 1.

The channel region T1 of the first transistor T1 may be bent at least once. For example, the channel region T1 may have a meandering shape or a zigzag shape.

The source region S1 and the drain region D1 are connected to both sides of the channel region T1 in a plan view of the display device 1.

The driving gate electrode G1 may be included in the first conductive layer GAT1 and may be connected to a connecting member CM1 through a contact hole CNT and the storage opening OP. The storage opening OP surrounds the contact hole CNT. The connecting member CM1 may be included in the third conductive layer SD1 in cross section. The connecting member CM1 may extend substantially parallel to the direction in which the data line DL extends. The connecting member CM1 corresponds to the driving gate node GN illustrated in the circuit diagram of FIG. 9 together with the driving gate electrode G1.

The second transistor T2 includes a channel region T2, a source region S2 and a drain region D2 which are conductive regions of the active pattern ACT located on both sides of the channel region T2, and a gate electrode G2 which overlaps the channel region T2 in a plan view of the display device 1. The gate electrode G2 is a part of the first scan line GWn. The source region S2 is located below the first scan line GWn in a plan view of the display device 1, connected to the channel region T2, and connected to the data line DL through a contact hole CNT. The drain region D2 is located below the first scan line GWn in a plan view of the display device 1, and connected to the channel region T2, and connected to the source region S1 of the first transistor T1.

The third transistor T3 may be composed of two parts to prevent leakage current. That is, the third transistor T3 may include a lower third transistor T3_1 and an upper third transistor T3_2 which are adjacent to each other and connected to each other.

The lower third transistor T3_1 includes a channel region T3_1 which overlaps the first scan line GWn in a plan view of the display device 1, a source region S3_1 and a drain region D3_1 which are conductive regions of the active pattern ACT located on both sides of the channel region T3_1, and a gate electrode G3_1 which overlaps the channel region T3_1. The gate electrode G3_1 may be a part of a protruding portion of the first scan line GWn. The drain region D3_1 is located below the first scan line GWn in a plan view of the display device 1 and is connected to the connecting member CM1 through a contact hole CNT.

The upper third transistor T3_2 includes a channel region T3_2 which overlaps the first scan line GWn in a plan view of the display device 1, a source region S3_2 and a drain region D3_2 which are conductive regions of the active pattern ACT located on both sides of the channel region. T3_2, and a gate electrode G3_2 which overlaps the channel region T3_2. The gate electrode G3_2 is a part of the first scan line GWn. The source region S3_2 of the upper third transistor T3_2 is connected to the drain region D1 of the first transistor T1, and the drain region D3_2 is connected to the source ref-lion S3_1 of the lower third transistor T3_1.

The fourth transistor T4 may also be composed of two parts to prevent leakage current. That is, the fourth transistor T4 may include a left fourth transistor T4_1 and a right fourth transistor T4_2 which are adjacent to each other and connected to each other.

The left fourth transistor T4_1 includes a channel region T4_1 which overlaps the second scan line GIn in a plan view of the display device 1, a source region S4_1 and a drain region D4_1 which are conductive regions of the active pattern ACT located on both sides of the channel region T4_1, and a gate electrode G4_1 which overlaps the channel region T4_1. The gate electrode G4_1 is a part of the second scan line GIn. The drain region D4_1 is located above the second scan line GIn in a plan view of the display device 1 and connected to the drain region D3_1 of the lower third transistor T3_1.

The right fourth transistor T4_2 includes a channel region T4_2 which overlaps the second scan line GIn in a plan view of the display device 1, a source region S4_2 and a drain region D4_2 which are conductive regions of the active pattern ACT located on both sides of the channel region T4_2, and a gate electrode G4_2 which overlaps the channel region T4_2. The gate electrode G4_2 is a part of the second scan line GIn. The drain region D4_2 may be connected to the source region S4_1 of the left fourth transistor T4_1, and the source region S4_2 may contact a connecting member CM2 through a contact hole CNT.

The connecting member CM2 may be included in the third conductive layer SD1 in cross section. The connecting member CM2 may contact the initialization voltage line Vint through a contact hole CNT.

The fifth transistor T5 includes a channel region T5, a source region S5 and a drain region D5 which are conductive regions of the active pattern ACT located on both sides of the channel region T5, and a gate electrode G5 which overlaps the channel region T5. The gate electrode G5 is a part of the control line EM. The source region S5 is located above the control line EM in a plan view of the display device 1, is connected to the channel region T5, and may contact the driving voltage line ELVDD through a contact hole CNT. The drain region D5 is located below the control line EM in a plan view of the display device 1, connected to the channel region T5 and connected to the source region S1 of the first transistor T1. The sixth transistor T6 includes a channel region T6, a source region S6 and a drain region D6 which are conductive regions of the active pattern ACT located on both sides of the channel region T6, and a gate electrode G6 which overlaps the channel region T6. The gate electrode G6 is a part of the control line EM. The source region S6 is located below the control line EM in a plan view of the display device 1, connected to the channel region T6, and connected to the drain region D1 of the first transistor T1. The drain region D6 is located above the control line EM in a plan view of the display device 1, is connected to the channel region T6, and may contact an anode ED_anode of the light emitting diode ED through a contact hole CNT. The anode ED_anode may be included in the third conductive layer SD1 in cross section.

The seventh transistor T7 includes a channel region T7, a source region S7 and a drain region D7 which are conductive regions of the active pattern ACT located on both sides of the channel region T7, and a gate electrode G7 which overlaps the channel region T7. The gate electrode G7 is a part of the second scan line GIn. The source region S7 is located below the second scan line GIn in a plan view of the display device 1, connected to the channel region T7, and connected to the drain region D6 of the sixth transistor T6. The drain region D7 is located above the second scan line GIn in a plan view of the display device 1 and contacts the connecting member CM2 through a contact hole CNT to receive the initialization voltage.

The capacitor Cst may include the driving gate electrode G1 and the second end Cst2 of the capacitor Cst, which overlap each other in a plan view of the display device 1, as two terminals. The capacitor Cst may maintain a voltage difference corresponding to a difference between the second end Cst2 of the capacitor Cst, to which a driving voltage is applied, and a voltage of the driving gate electrode G1. The second end Cst2 of the capacitor Cst may have a larger area than the driving gate electrode G1 in a plan view of the display device 1 and cover the entire area of the driving gate electrode G1.

The second conductive layer GAT2 may further include a shielding pattern CP which overlaps the data line DL. The shielding pattern CP may contact the driving voltage line ELVDD through a contact hole CNT to receive a driving voltage. The shielding pattern CP may shield a space between the driving gate node GN and the data line DL to prevent a voltage change of the driving gate node GN due to a change of the data signal. The shielding pattern CP can be omitted.

Connecting wires BR may include portions BR1_A and BR1_B overlapping a pixel and extending obliquely from an upper right end to a lower left end in the pixel PX. Connecting wires BR may include a portion BR2 overlapping another pixel PX and extending straight from a lower end to an upper end in the pixel PX.

A connecting wire section BR1_A extending obliquely may extend from the drain region D3_2 of the upper third transistor T3_2 to a point between the second scan line Gin and the initialization voltage line Vint of the corresponding pixel PX. Another connecting wire section BR1_B extending obliquely may extend from the drain region D6 of the sixth transistor T6 to a point between the control line EM and the first scan line GWn of the corresponding pixel PX. A connecting wire section BR2 extending straight may overlap the driving voltage line ELVDD in the pixel electrode PE thickness direction.

Referring to FIGS. 12 and 14, a buffer layer 120 may be located on the substrate 110. The buffer layer 120 prevents impurities from being introduced from the substrate 110 to layers (in particular, the active pattern ACT) disposed on the buffer layer 120, thereby improving the characteristics of the active pattern ACT and relieving stress. The buffer layer 120 may include an inorganic insulating material, such as silicon nitride (SiNx) or silicon oxide (SiOx), and/or an organic insulating material. At least a portion of the buffer layer 120 can be omitted.

The active pattern ACT may be located on the buffer layer 120. According to an embodiment, the active pattern ACT may include the channel region T4_1, the source region S4_1 and the drain region D4_1 of the left fourth transistor T4_1 and the drain region D3 of the third transistor T3.

A first insulating layer 130 (GI) may be located on the active pattern ACT. The thickness of the first insulating layer 130 (GI) tray be at least about 1500 Å. The first conductive layer GAT1 may be located on the first insulating layer 130 (GI). The first conductive layer GAT1 may include the gate electrode G4_1 of the left fourth transistor T4_1. The first conductive layer GAT1 may include a metal such as copper (Cu), molybdenum (Mo), or an alloy.

A second insulating layer 140 (ILD1) may be disposed on the first conductive layer GAT1 and the first insulating layer 130 (GI). The second conductive layer GAT2 may be located on the second insulating layer 140 (ILD1). The second conductive layer GAT2 may include the shielding pattern CP. The second conductive layer GAT2 may include a metal such as copper (Cu), molybdenum (Mo), or an alloy.

A third insulating layer 150 (ILD2) may be disposed on the second conductive layer GAT2 and the second insulating layer 140 (ILD1). At least one of the first insulating layer 130 (GI), the second insulating layer 140 (ILD1), and the third insulating layer 150 (ILD2) may include an inorganic insulating material, such as silicon nitride (SiNx) or silicon oxide (SiOx), and/or an organic insulating material.

The third conductive layer SD1 may be located on the third insulating layer 150 (ILD2). The third conductive layer SD1 may include the driving voltage line ELVDD and the gate electrode G1 of the first transistor T1. The driving voltage line ELVDD may contact the shielding pattern CP through a contact hole CNT formed in the third insulating layer 150 (ILD2). The third conductive layer SD1 may include a flexible material such as aluminum (Al) or a stacked layer of Ti/Al/Ti.

A fourth insulating layer 160 (VIA1) may be disposed on the third conductive layer SD1 and the third insulating layer 150 (ILD2). The fourth insulating layer 160 (VIA1) may include an organic insulating material such as polyacrylics resin or polyimide resin. An upper surface of the fourth insulating layer 160 (VIA1) may be substantially flat. the fourth insulating layer 160 (VIA1) may also include an inorganic insulating material such as silicon nitride (SiNx) or silicon oxide (SiOx). Therefore, the size of a contact hole CNT may be reduced.

A fourth conductive layer SD2 may be located on the fourth insulating layer 160 (VIA1). The fourth conductive layer SD2 may include the connecting wires BR, including the sections BR1_A, BR1_B, and BR2. The fourth conductive layer SD2 may include a flexible material such as aluminum (Al) and/or may include a stacked structure of titanium-aluminum-titanium (Ti—Al—Ti).

A fifth insulating layer 170 (VIA2) is located on the fourth conductive layer SD2 and the fourth insulating layer 160 (VIA1). The fifth insulating layer 170 (VIA2) may include an organic insulating material such as polyacrylics resin or polyimides resin, and an upper surface of the fifth insulating layer 170 (VIA2) may be substantially flat.

A fifth conductive layer may be located on the fifth insulating layer 170 (VIA2). A pixel defining layer HMDL may be located on the fifth insulating layer 170 (VIA2) and the fifth conductive layer.

Although not illustrated, the pixel defining layer HPDL may have an opening exposing a pixel electrode PE. A light emitting layer may be located on the pixel electrode PE. The light emitting layer may be located in the opening. The light emitting layer may include an organic light emitting material or an inorganic light emitting material. A common electrode may be located on the light emitting layer. The common electrode may also be formed on the pixel definition layer HPDL and may extend over a plurality of pixels. The pixel electrode PE, the light emitting layer, and a corresponding portion of the common electrode may form the light emitting diode ED. A sealing layer for protecting the light emitting diode ED may be located on the common electrode. The sealing layer rimy include inorganic layers and organic layers stacked alternately.

Figure 15:
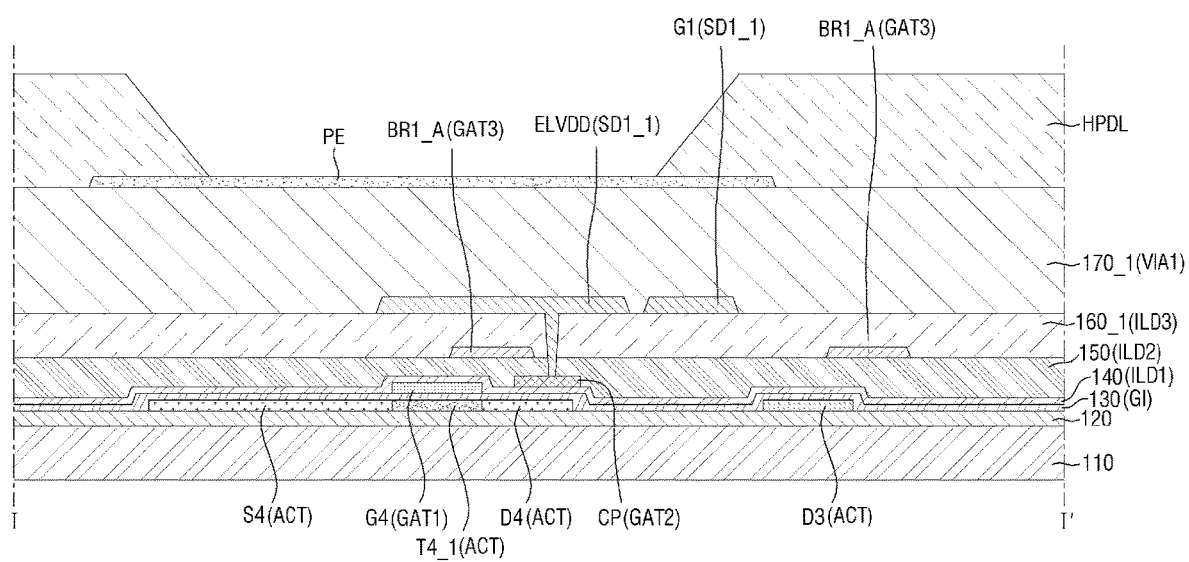
FIG. 15 is a cross-sectional view taken along the line I-I' of FIG. 11 according to an embodiment.

FIG. 15 is a cross-sectional view taken along the line I-I' of FIG. 11 according to an embodiment. Some structures illustrated in FIG. 15 may be identical to or analogous to some structures illustrated in FIG. 12.

Referring to FIG. 15, the pixel structures are different from the pixel structures of FIG. 12 in that a connecting wire section BR1_A is located on a third insulating layer 150 (ILD2), and that a driving voltage line ELVDD and a gate region G1 of a first transistor T1 are located on a sixth insulating layer 160_1 (ILD3).

A sixth conductive layer GAT3 may be located on the third insulating layer 150 (ILD2). The sixth conductive layer GAT3 may include connecting wires BR, including the sections BR1_A, BR1_B and BR2. The sixth conductive layer GAT3 may include a metal such as copper (Cu), molybdenum (Mo), or an alloy.

The sixth insulating layer 160_1 (ILD3) may be located on the sixth conductive layer GAT3 and the third insulating layer 150 (ILD2). At least one of the third insulating layer 150 (ILD2) and the sixth insulating layer 160_1 (ILD3) may include an inorganic insulating material, such as silicon nitride (SiNx) or silicon oxide (SiOx), and/or an organic insulating material.

A seventh conductive layer SD1_1 may be located on the sixth insulating layer 160_1 (ILD3). The seventh conductive layer SD1_1 may include the driving voltage line ELVDD and the gate electrode region G1 of the first transistor T1. The driving voltage line ELVDD may contact a shielding pattern CP through a contact hole CNT formed in the third insulating layer 150 (ILD2) and the sixth insulating layer 160_1 (ILD3). The seventh conductive layer SD1_1 may include a flexible material such as aluminum (Al) or a stacked layer of Ti/Al/Ti.

A seventh insulating layer 170_1 (VIA1) is located on the seventh conductive layer SD1_1 and the sixth insulating layer 160_1 (ILD3). The seventh insulating layer 170_1 (VIA1) may include an organic insulating material such as polyacrylics resin or polyimides resin, and an upper surface of the seventh insulating layer 170_1 (VIA1) may be substantially flat.

Figure 16:
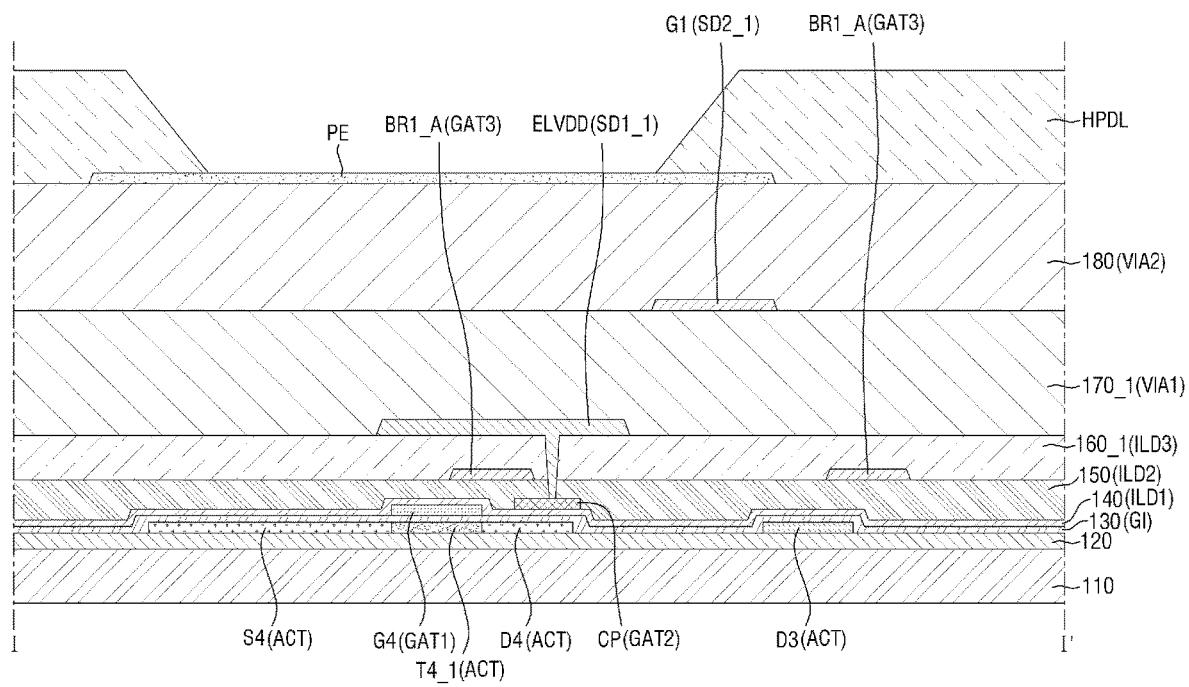
FIG. 16 is a cross-sectional view taken along line I-I' of FIG. 11 according to an embodiment.

FIG. 16 is cross-sectional view taken along the line I-I' of FIG. 11 according to an embodiment. Some structures illustrated in FIG. 16 may be identical to or analogous to some structures illustrated in FIG. 15 and/or FIG. 12.

Referring to FIG. 16, the pixel structures are different from the pixel structures of FIG. 15 in that a gate region G1 of a first transistor T1 is located on a seventh insulating layer 170_1 (VIA1), and that an eighth insulating layer 180 (VIA2) is provided.

A seventh conductive layer SD1_1 may be located on a sixth insulating layer 160_1 (ILD3). The seventh conductive layer SD1_1 may include a driving voltage line ELVDD. The driving voltage line ELVDD may contact a shielding pattern CP through a contact hole CNT formed in a third insulating layer 150 (ILD2) and the sixth insulating layer 160_1 (ILD3). The seventh conductive layer SD1_1 may include a flexible material such as aluminum (Al) or a stacked layer of Ti/Al/Ti.

The seventh insulating layer 170_1 (VIM) may be located on the seventh conductive layer SD1_1 and the sixth insulating layer 160_1 (ILD3). The seventh insulating layer 170_1 (VIA1) may include an organic insulating material such as polyacrylics resin or polyimides resin, and an upper surface of the seventh insulating layer 170_1 (VIA1) may be substantially flat.

An eighth conductive layer SD2_1 may be located on the seventh insulating layer 170_1 (VIA1). The eighth conductive layer SD2_1 may include the gate region G1 of the first transistor T1. The eighth insulating layer 180 (VIA2) may be located on the eighth conductive layer SD2_1 and the seventh insulating layer 170_1 (VIA1). The eighth insulating layer 180 (VIA2) may include an organic insulating material such as polyacrylics resin or polyimides resin, and an upper surface of the eighth insulating layer 180 (VIA2) may be substantially flat.

Figure 17:
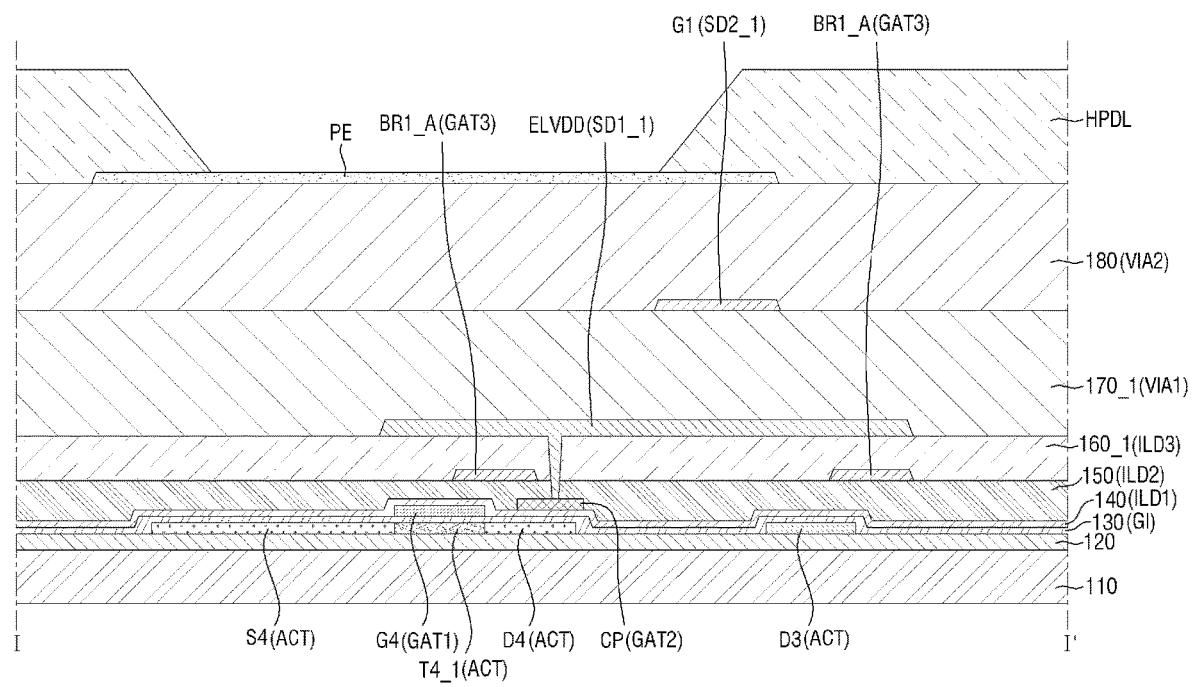
FIG. 17 is a cross-sectional view taken along line I-I' of FIG. 11 according to an embodiment.

FIG. 17 is cross-sectional view taken along the line I-I' of FIG. 11 according to an embodiment. Some structures illustrated in FIG. 17 may be identical to or analogous to some structures illustrated in FIG. 16, FIG. 15, and/or FIG. 12.

Referring to FIG. 17, the pixel structures are different from the pixel structures of FIG. 15 in that a gate region G1 of a first transistor T1 and a connecting wire section BR1_A are shielded by an extended driving voltage line ELVDD_1.

The driving voltage line ELVDD illustrated in FIG. 15 may overlap, in the pixel electrode PE thickness direction, an area extending from a gate region G4 to a drain region D4 of a left fourth transistor T4_1. The driving voltage line ELVDD_1 may be wider in a plan view of the display device 1. The driving voltage line ELVDD_1 may overlap, in the thickness direction, an area extending from a gate region G4 of a left fourth transistor T4_1 to the connecting wire section BR1_A, which partially overlaps a drain region D3 of a third transistor T3 in the thickness direction. Therefore, unwanted coupling between the gate region G1 of the first transistor T1 and the connecting wire BR1_A may be minimized.

Many variations and modifications can be made to the described embodiments without departing from the scope of the claims.

What is claimed is:

1. A display device comprising:
   a first pixel;
   a second pixel;
   a first data line electrically connected to the first pixel;
   a second data line electrically connected to the second pixel and electrically insulated from the first data line;
   a first signal wire electrically connected to the first data line;
   a second signal wire electrically connected to the second data line; and
   a connecting wire electrically connecting the second data line to the second signal wire, wherein the connecting wire comprises a first section and a second section, wherein the second section is directly connected to the first section, overlaps the first pixel, overlaps the first data line, and is oblique relative to each of the first data line and the second data line in a plan view of the display device.

2. The display device of claim 1, wherein the second section is at an acute angle relative to the first section in the plan view of the display device.

3. The display device of claim 1, further comprising a third pixel, wherein the first section overlaps the third pixel.

4. The display device of claim 1, wherein the connecting wire is connected to the second signal wire through a first contact hole, wherein the connecting wire is connected to the second data line through a second contact hole, and wherein a portion of the first data line is positioned between the first contact hole and the second contact hole.

5. The display device of claim 1, wherein the connecting wire is connected to the second signal wire through a first contact hole, wherein the first contact hole is located beyond a display area of the display device in a lengthwise direction of the first section, and wherein the first pixel and the second pixel are located in the display area of the display device.

6. The display device of claim 5, wherein the connecting wire is connected to the second data line through a second contact hole, and wherein the second contact hole is located beyond the display area of the display device in a lengthwise direction of the second section.

7. The display device of claim 1, wherein the first pixel and the second pixel are located in a display area of the display device, wherein a non-display area of the display device neighbors the display area of the display device, and wherein a boundary between the display area of the display device and the non-display area of the display device intersects both the first section and the second section in the plan view of the display device.

8. The display device of claim 1, wherein a material of the first signal wire is identical to a material of the second signal wire.

9. The display device of claim 1, wherein the first section of the connecting wire is parallel to the first data line in the plan view of the display device, and wherein the second section of the connecting wire intersects the first data line in the plan view of the display device.

10. The display device of claim 1, wherein the first of section the connecting wire overlaps the first data line, and wherein an edge of the first section of the connecting wire is parallel to an edge of the first data line.

11. The display device of claim 1, wherein the connecting wire is formed of at least one of aluminum (Al) and titanium (Ti).

12. The display device of claim 1, wherein the second signal wire is connected to the connecting wire through a third signal wire, and wherein a material of the third signal wire is identical to a material of the first data line.

13. The display device of claim 1, further comprising a first organic insulating layer disposed between the connecting wire and each of the first data line and the second data line.

14. The display device of claim 13, wherein the first organic insulating layer has a thickness of at least 15000 Å.

15. The display device of claim 14, wherein the first organic insulating layer is formed of at least one of polyacrylics resin and polyimides resin.

16. The display device of claim 1, further comprising a second organic insulating layer covering the connecting wire.

17. The display device of claim 1, further comprising an inorganic insulating layer disposed between the connecting wire and the first data line.

18. The display device of claim 1, wherein the first data line is disposed between the connecting wire and a pixel electrode of the first pixel in a direction perpendicular to a face of the pixel electrode of the first pixel.

19. The display device of claim 18, further comprising an organic insulating layer covering the first data line.

20. The display device of claim 19, wherein the connecting wire comprises at least one of copper (Cu) and molybdenum (Mo).

* * * * *